United States Patent
Tsuji et al.

(10) Patent No.: US 6,693,162 B2
(45) Date of Patent: Feb. 17, 2004

(54) POLYIMIDE RESIN AND RESIN COMPOSITION, ADHESIVE SOLUTION, FILM-STATE JOINING COMPONENT, AND ADHESIVE LAMINATE FILM IMPROVED IN MOISTURE RESISTANCE USING IT, AND PRODUCTION METHODS THEREFOR

(75) Inventors: Hiroyuki Tsuji, Otsu (JP); Hiroyuki Furutani, Takatsuki (JP); Koichiro Tanaka, Otsu (JP); Takeshi Kikuchi, Otsu (JP)

(73) Assignee: Kaneka Japan Corporation, Osaka (JP)

( * ) Notice: Subject to any disclaimer, the term of this patent is extended or adjusted under 35 U.S.C. 154(b) by 0 days.

(21) Appl. No.: 09/958,612

(22) PCT Filed: Apr. 4, 2000

(86) PCT No.: PCT/JP00/02181

§ 371 (c)(1),
(2), (4) Date: Oct. 9, 2001

(87) PCT Pub. No.: WO00/61658

PCT Pub. Date: Oct. 19, 2000

(65) Prior Publication Data

US 2003/0045669 A1 Mar. 6, 2003

(30) Foreign Application Priority Data

| Apr. 9, 1999 | (JP) | 11-102066 |
| Apr. 21, 1999 | (JP) | 11-113796 |
| Apr. 21, 1999 | (JP) | 11-114191 |
| Apr. 21, 1999 | (JP) | 11-114224 |
| Nov. 5, 1999 | (JP) | 11-316034 |
| Nov. 5, 1999 | (JP) | 11-316035 |
| Feb. 23, 2000 | (JP) | 2000-045542 |

(51) Int. Cl.$^7$ .......... C08G 73/10; C08L 77/00; C08L 79/00

(52) U.S. Cl. .......... 528/170; 528/26; 528/125; 528/126; 528/128; 528/171; 528/172; 528/173; 528/176; 528/183; 528/185; 528/188; 528/220; 528/229; 528/350; 528/352; 528/353; 524/600; 524/606; 428/411.1; 428/473.5; 525/222; 525/422; 525/431

(58) Field of Search .......... 528/26, 125, 126, 528/128, 171, 172, 353, 173, 352, 185, 178, 176, 188, 120, 229, 350; 524/600, 602; 525/222; 428/411.1, 473.5

(56) References Cited

U.S. PATENT DOCUMENTS

| 3,981,847 A | 9/1976 | Meyer et al. |
| 4,681,928 A | 7/1987 | Berger et al. |
| 5,397,849 A | 3/1995 | Shimizu et al. |
| 5,608,013 A | 3/1997 | Matsuura et al. |
| 5,621,068 A | 4/1997 | Okamoto et al. |
| 5,668,247 A | * 9/1997 | Furutani et al. .......... 528/353 |
| 5,955,779 A | 9/1999 | Matsuura et al. |
| 5,958,653 A | 9/1999 | Matsuura et al. |
| 6,046,072 A | 4/2000 | Matsuura et al. |
| 6,350,844 B1 | * 2/2002 | Ono et al. .......... 528/170 |

FOREIGN PATENT DOCUMENTS

| JP | 63-117075 | 5/1988 |
| JP | 63-189490 | 8/1988 |
| JP | 02-009847 | 1/1990 |
| JP | 02-009848 | 1/1990 |
| JP | 02-245070 | 9/1990 |
| JP | 02-245071 | 9/1990 |
| JP | 03-195732 | 8/1991 |
| JP | 3195732 A2 | 8/1991 |
| JP | 04-222831 | 8/1992 |
| JP | 05-086183 | 4/1993 |
| JP | 05-331116 | 12/1993 |
| JP | 06-128462 | 5/1994 |
| JP | 06-184903 | 7/1994 |
| JP | 06-184904 | 7/1994 |
| JP | 06-248241 | 9/1994 |
| JP | 06-256472 | 9/1994 |

(List continued on next page.)

Primary Examiner—P. Hampton-Hightower
(74) Attorney, Agent, or Firm—Brinks Hofer Gilson & Lione

(57) ABSTRACT

The present invention provides a polyimide resin, a resin composition, an adhesive solution, a film-state joining component, and an adhesive laminate film soluble in a solvent having excellent heat resistance and adhesion, capable of bonding and curing at relatively low temperatures. Specifically, the present invention provides a novel polyimide resin having low water absorption obtained by a reaction between tetracarboxylic acid dianhydride containing ester-acid dianhydride represented by the general formula (1):

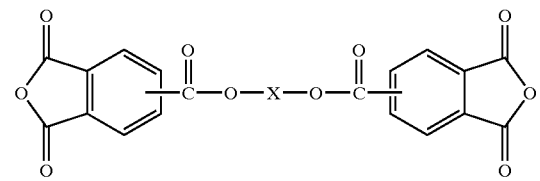

wherein X represents —$(CH_2)_k$—, or is a divalent group which comprises an aromatic ring, and k is an integer from 1 to 10; and aromatic diamine, where the resin composition and the film-state joining component which comprise a thermosetting resin with excellent adhesion using this resin are preferably used for flexible printed circuit boards, tapes for TAB (Tape Automated Bonding), composite lead frames, and lamination materials, or the like, and an adhesive laminate film suitable for coating of a superconductive wire rod.

27 Claims, 4 Drawing Sheets

FOREIGN PATENT DOCUMENTS

| | | |
|---|---|---|
| JP | 94096685 B2 | 11/1994 |
| JP | 06-340808 | 12/1994 |
| JP | 07-003019 | 1/1995 |
| JP | 07-062096 | 3/1995 |
| JP | 07-062097 | 3/1995 |
| JP | 07-070318 | 3/1995 |
| JP | 07-070539 | 3/1995 |
| JP | 07-137196 | 5/1995 |
| JP | 07-198090 | 8/1995 |
| JP | 07-205255 | 8/1995 |
| JP | 08-100062 | 4/1996 |
| JP | 08-143668 | 6/1996 |
| JP | 08-176524 | 7/1996 |
| JP | 08-197695 | 8/1996 |
| JP | 08-199124 | 8/1996 |
| JP | 08-217877 | 8/1996 |
| JP | 08-273974 | 10/1996 |
| JP | 08-294993 | 11/1996 |
| JP | 09-001723 | 1/1997 |
| JP | 09-077869 | 3/1997 |
| JP | 09-077871 | 3/1997 |
| JP | 09-286858 A * | 11/1997 |
| JP | 09-286858 | 11/1997 |
| JP | 09-291151 | 11/1997 |
| JP | 09-302091 | 11/1997 |
| JP | 10-130594 | 5/1998 |
| JP | 2762744 B2 | 6/1998 |
| JP | 10-219110 | 8/1998 |
| JP | 10-226751 | 8/1998 |
| JP | 10-237300 | 9/1998 |
| JP | 11-050037 | 2/1999 |

* cited by examiner (a)

(b)

(a)

(b)

POLYIMIDE RESIN AND RESIN COMPOSITION, ADHESIVE SOLUTION, FILM-STATE JOINING COMPONENT, AND ADHESIVE LAMINATE FILM IMPROVED IN MOISTURE RESISTANCE USING IT, AND PRODUCTION METHODS THEREFOR

RELATED APPLICATIONS

This application is related to, and claims priority from the following international applications: PCT Application No. PCT/JP00/02181 designating the United States, filed Apr. 4, 2001, and Japan Application 11/102066, filed Apr. 9, 1999; Japan Application 11/113796, filed Apr. 21, 1999; Japan Application 11/114191, filed Apr. 21, 1999; Japan Application 11/114224, filed Apr. 21, 1999; Japan Application 11/316034, filed Nov. 5, 1999; Japan Application 11/316035, filed Nov. 5, 1999; Japan Application 2000/45542, filed Feb. 23, 2000.

TECHNICAL FIELD

The present invention relates to a novel polyimide resin and a resin composition, an adhesive solution, a film-state joining component, and an adhesive laminate film which comprise the polyimide resin and to production methods therefor. The present invention is useful as a material for an adhesive having excellent heat resistance and adhesion, which is used for a flexible printed circuit board, a tape for TAB (Tape Automated Bonding), a composite lead frame, and a lamination material, or the like. Further, it relates to a laminate film suitable for a wire rod coating for superconductivity.

BACKGROUND ART

Recently, downsizing and weight reduction of electronic parts has been demanded, as electronic devices have been more and more efficient, highly functional, and downsized. Therefore, packaging methods of semiconductor elements as well as higher density, higher efficiency, and higher function of wiring materials or parts for packaging have also been demanded. Especially, there has been a demand for materials showing excellent adhesion which may be preferably used as high-density packaging materials, such as semiconductor packages, COL (Chip on Lead) packages, LOC (Lead on Chip) packages, and MCM (Multi Chip Module) or the like, and printed-wiring board materials such as multilayer FPC (Flexible Printed Circuit) as well as aerospace materials.

Conventionally, adhesives such as acrylic adhesives, phenol-type adhesives, epoxy-type adhesives, and polyimide-type adhesives or the like are known for their superior mechanical characteristics, heat resistance, and insulating properties in semiconductor packages and other packaging materials.

Phenol-type and epoxy-type adhesives with excellent adhesion are, however, poor in flexibility. There was a problem that acrylic adhesives having excellent flexibility are poor in heat resistance.

In order to solve the aforesaid problems, polyimide is to be used. Among a variety of organic polymers, polyimide is in widespread application of the aerospace field to the electronic communications field and is also used as an adhesive because of its excellent heat resistance. However, a high temperature around 300° C. and high pressure are required for bonding of a polyimide adhesive having excellent heat resistance, whose adhesive strength is not such high. Further, since a conventional polyimide adhesive has high water absorption and contains many residual volatile components (the absorbed moisture and the solvent used for producing an adhesive), for example, a problem such as swelling has easily arisen when a lead frame using this polyimide adhesive is dip-soldered.

Furthermore, polyimide is soluble only in a few kinds of solvents, such as N,N-dimethylformaide, DMAc, and NMP (N-methylpyrrolidone) or the like because of its very poor solubility in organic solvents. In addition, it has revealed that these high-boiling solvents are not fully removable even after drying of the adhesive solution applied onto a film, therefore, the residual solvent content in the film leads to a cause of foaming.

On the other hand, recent development of elementary particle physics has accelerated to build particle accelerators which generate further high energy. For the high energy to be generated, an electromagnet, which can generate high magnetic fields by the passage of a large current, is needed. The use of superconductive magnets with superconductive wire rods have been increased. An oxide having copper as the main constituent is often used as a material for a superconductive wire rod. Characteristics of the electromagnet may be deteriorated by variations in the oxidization condition of the superconductive wire rod by heating when a thermosetting adhesive is used to coat a superconductive wire rod with an insulating coating material. It is, therefore, essential for such application to use an adhesive which can be cured and bonded at low temperatures.

Further, accelerators are devices which accelerate elementary particles, such as protons and electrons, and make protons and protons, and electrons and electrons to decay by colliding them each other and examine particles emitted from the decay, wherein a great amount of radiation is generated considering from the nature of the devices. Accordingly, superior radiation resistance is required for insulating coating materials and adhesives.

In the application for these superconductive magnets, particularly in the coating of wire rods for superconductivity used at an extremely low temperature, laminates made by depositing thermosetting resins having epoxy resin as the main agent on polyimide films have been used so far.

In this case, however, epoxy resins do not show sufficient radiation resistance. In addition, in the future, radiation resistance is increasingly required because the amount of radiation is estimated to increase with growth of energy of accelerators. Furthermore, polyimide can be listed as thermal fused layers with excellent radiation resistance, however, it has become a problem that the thermal fused polyimide is bonded at a high temperature, while polyimide which can be bonded at a low temperature is poor in heat resistance, adhesion, and resins squeezing out at pressing. To solve the above problems, adhesives which can be bonded at low temperatures and have excellent radiation resistance have been needed.

Accordingly, it is an object of the present invention to provide a polyimide resin which is excellent in low water absorption, heat resistant for solders, heat resistance, and adhesion.

It is another object of the present invention to provide a resin composition which comprises a polyimide resin capable of being cured to be bonded at a relatively low temperature, and is soluble in solvent and excellent in heat resistance and adhesion.

It is further another object of the present invention to provide an adhesive solution wherein a solvent is easily removable from a film while keeping its heat resistance and adhesion, and a joining component in a film state obtained by using the adhesive solution.

It is still another object of the present invention to develop an adhesive laminate film for wire rod coating which is excellent in flexibility and adhesion, and the like without any deterioration of the wire rod when coating with it.

DISCLOSURE OF THE INVENTION

The polyimide resin of the present invention is obtained by reacting tetracarboxylic acid dianhydride containing ester acid dianhydride represented by the general formula (1):

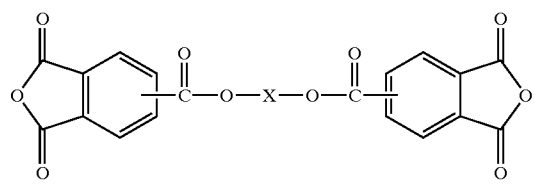

(1)

wherein X represents $-(CH_2)_k-$, or is a divalent group which comprises an aromatic ring; k is an integer from 1 to 10; with diamine containing an aromatic diamine represented by the general formula (2):

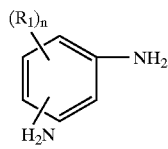

(2)

wherein $R_1$ represents alkyl, fluoro-alkyl, and alkoxyl groups or a halogen group; n may be an integer from 0 to 4; and $R_1$ whose number is n is the same or different; and/or an aromatic diamine represented by the general formula (3):

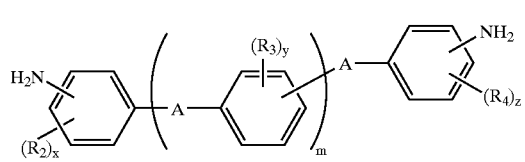

(3)

wherein A is at least one selected from the groups consisting of a single bond, $-O-$, $-(CH_2)_n-$, $-CO-$, $-C(=O)$ $O-$, $-NHCO-$, $-C(CH_3)_2-$, $-C(CF_3)_2-$, $-S-$, or $-SO_2-$, $R_2$, $R_3$, and $R_4$ represent independently alkyl, fluoro-alkyl, and alkoxyl groups or a halogen group, and are the same or different, x, y, z, m, and n are each an integer from 0 to 4. A whose number is n (m+1) may be respectively the same or different.

Or the polyimide resin of the present invention is obtained by a reaction between tetracarboxylic acid dianhydride containing ester acid dianhydride represented by the general formula (1):

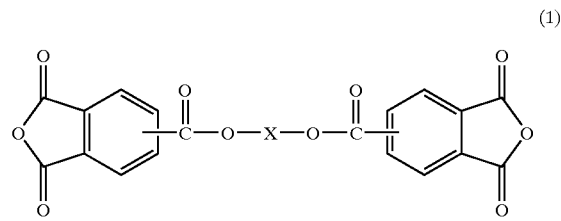

(1)

wherein X represents $-(CH_2)_k-$ or is a divalent group which comprises an aromatic ring; k is an integer from 1 to 10); and aromatic diamine represented by the general formula (4):

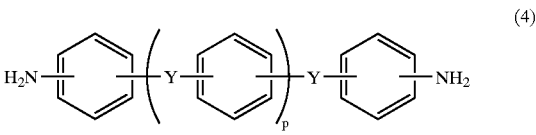

(4)

wherein Y is at least one selected from the groups consisting of a single bond, $-CO-$, $-SO_2-$, $-O-$, $-S-$, $-(CH_2)_q-$, $-NHCO-$, $-C(CH_3)_2-$, $-C(CF_3)_2-$, or $-C(=O)O-$; p and q are each an integer from 1 to 5.

Further, the polyimide resin of the present invention is obtained by reacting tetracarboxylic acid dianhydride containing ester-acid dianhydride represented by the general formula (1):

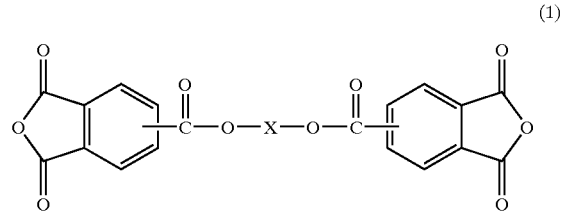

(1)

wherein X represents $-(CH_2)_k-$ or is a divalent group comprising an aromatic ring; k is an integer from 1 to 10; with aromatic diamine represented by the general formula (4):

(4)

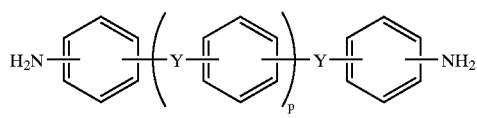

wherein Y is at least one selected from the groups consisting of a single bond, —CO—, —SO$_2$—, —O—, —S—, —(CH$_2$)$_q$—, —NHCO—, —C(CH$_3$)$_2$—, —C(CF$_3$)$_2$—, or —C(=O)O—; p and q are each an integer from 1 to 5; and siloxane diamine represented by the general formula (5):

(5)

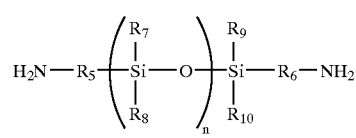

Wherein R$_5$ and R$_6$ are each a divalent aliphatic group whose carbon number is from 1 to 4 or a divalent aromatic group, R$_7$, R$_8$, R$_9$, and R$_{10}$ are each a monovalent aliphatic group whose carbon number is from 1 to 4 or a monovalent aromatic group; n is an integer from 1 to 10.

Other general explanation of the polyimide resin of the present invention is that the polyimide resin is obtained by a reaction among tetracarboxylic acid dianhydride containing 2,2-(4-hydroxyphenyl) propanedibenzoate-3,3'4,4'-tetracarboxylic acid dianhydride represented by the general formula (7):, and diamine containing aromatic diamine represented by the general formula (3):

(3)

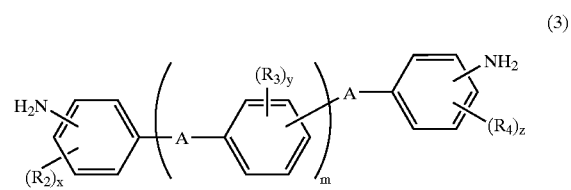

wherein A is at least one selected from the groups consisting of a single bond, —O—, —(CH$_2$)$_n$—, —CO—, —C(=O)O—, —NHCO—, —C(CH$_3$)$_2$—, —C(CF$_3$)$_2$—, —S—, or —SO$_2$—; R$_2$, R$_3$, and R$_4$ represent independently alkyl, fluoro-alkyl, and alkoxyl groups or a halogen group, and may be the same or different; x, y, z, m, and n are each an integer from 0 to 4; and A whose number is (m+1) may be respectively the same or different.

Tetracarboxylic acid dianhydride containing 2,2-(4-hydroxyphenyl) propanedibenzoate-3,3'4,4'-tetracarboxylic acid dianhydride represented by the general formula (7) can be adjusted to have a residual impurities content of 1 wt % or lower.

(7)

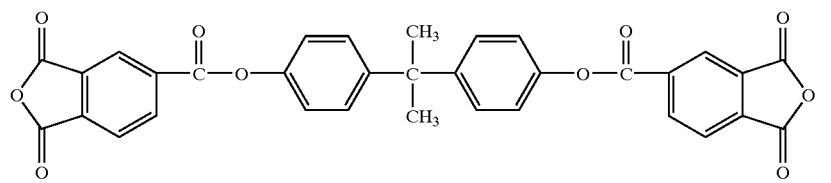

aromatic diarine represented by the general formula (2):

(2)

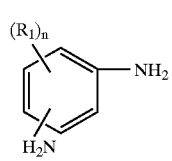

Wherein R$_1$ represents alkyl, fluoro-alkyl, and alkoxyl groups or a halogen group; n is an integer from 0 to 4; R$_1$ whose number is n may be the same or different, and/or (7)

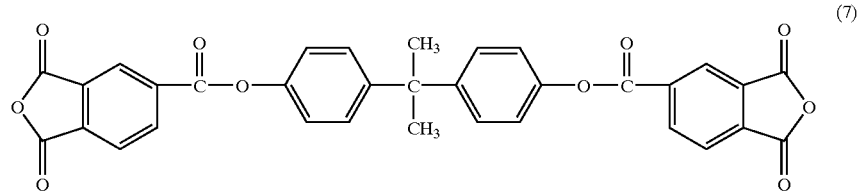

These polyimide resins may have both a glass transition temperature from 100° C. to 250° C. and water absorption of 1.5% or lower.

Further, the resin composition of the present invention comprises the polyimide resin and a thermosetting resin.

The resin composition of the present invention may have water absorption after cured of 1.5% or lower.

Furthermore, the resin composition of the present invention may have a residual volatile component of 3 wt % or lower.

Further, the polyimide resin may be a resin composition which is an amine-terminated polyimide oligomer.

The cured resin of the present invention obtained by curing the above-mentioned resin composition may have water absorption of 1.5% or lower.

Its residual volatile component may be 3 wt % or lower.

The polyimide adhesive solution of the present invention is comprised the above polyimide resin, epoxy resin, and curing agent, wherein 50 mole % or more of a dianhydride residue included in the polyimide resin is an ester-acid dianhydride residue represented by the general formula (1):

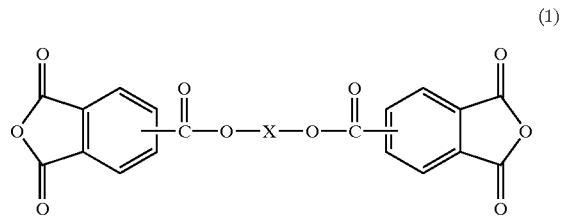

(1)

wherein X, represents —$(CH_2)_k$—, or is a divalent group which comprises an aromatic ring; and k is an integer from 1 to 10; and the organic solvent may include a cyclic ether solvent.

The general description of the film-state joining component of the present invention is formed by laminating a thermosetting resin on one side or both sides of a base film with a main constituent of the above polyimide resin.

Other general description of the film-state joining component of the present invention is formed by laminating the above resin composition on one side or both sides of the polyimide base film. Further, the film-state joining component of the present invention is obtained by dissolving the above resin composition in an organic solvent and applying or flow casting the composition onto a support, and subsequently depositing the film-like resin composition layer obtained by peeling off a coating film from the support after being dried. Or the film-state joining component is obtained by dissolving the above mentioned resin composition in an organic solvent and applying or flow casting the composition onto at least one side of the polyimide base film, and drying it subsequently. In addition, the film-state joining component of the present invention is obtained by applying the above polyimide adhesive solution by applying or flow casting onto the support and peeling off the adhesive coating film from the support after being dried. Or the film-state joining component is obtained by applying the above polyimide adhesive solution or flow casting it onto at least one side of the polyimide base film and drying it subsequently.

Moreover, the above mentioned film-state joining component may be used for the adhesive laminate film for wire rod coating.

BRIEF DESCRIPTION OF THE DRAWING

FIG. 4(a) shows a coating process and FIG. 4(b) shows a status of the coated laminate film after being processed.

BEST MODE FOR CARRYING OUT THE INVENTION

Figure 1:
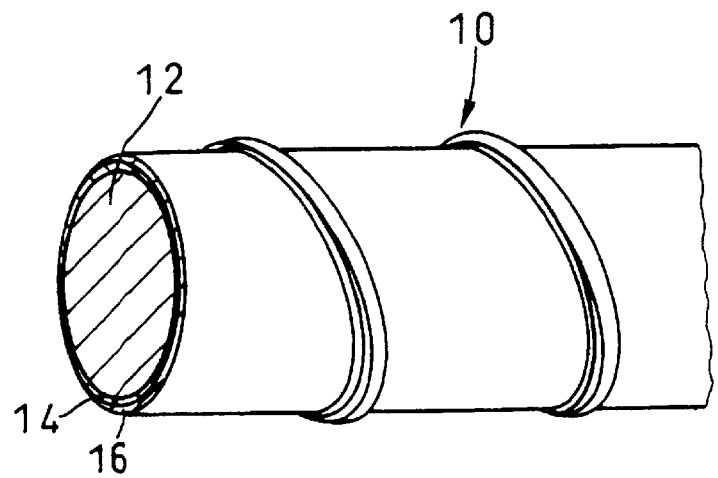
FIG. 1 is a perspective illustration view to explain a method for coating a wire rod with an adhesive laminate film for wire rod coating according to the present invention.
Figure 2:
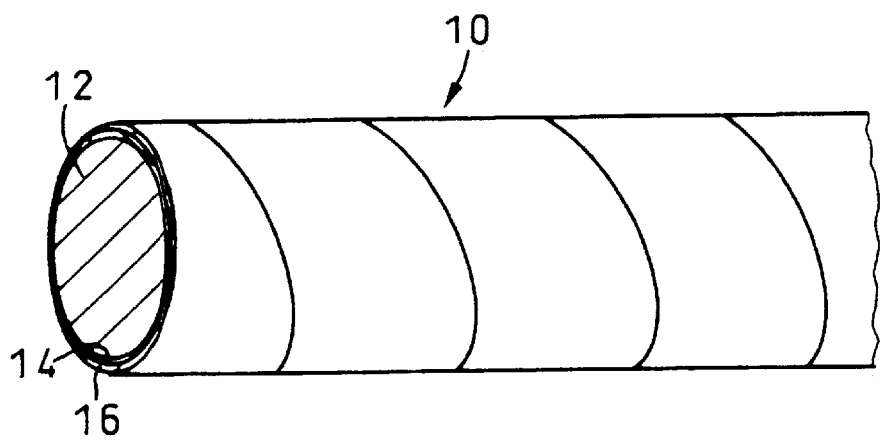
FIG. 2 is a perspective illustration view to explain another method for coating a wire rod with an adhesive laminate film for wire rod coating according to the present invention.

The polyimide resin of the present invention is synthesized from tetracarboxylic acid dianhydride containing ester acid dianhydride represented by the general formula (1) (wherein X is a divalent group which comprises an aromatic ring) and diamine represented by the general formula (2) and/or formula (3).

Ester acid dianhydride is represented by the general formula (1):

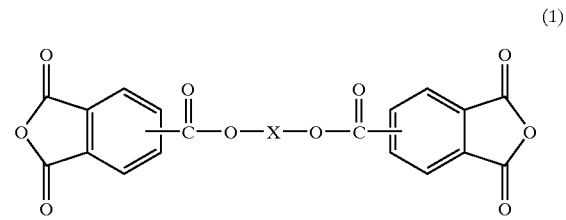

(1)

wherein X represents —$(CH_2)_k$—, or is a divalent group which comprises an aromatic ring: and k is an integer from 1 to 10.

The polyimide resin using an ester acid dianhydride represented by the general formula (1) has a superior characteristic in heat resistance of solders so as to its excellent water absorption factor. As a preferred example of an ester acid dianhydride used in the present invention, 2,2-bis (4-hydroxyphenyl) propanedibenzoate-3,3',4,4'-tetracarboxylic acid dianhydride, p-phenylene-bis (trimellitic acid monoester anhydride), 3,3',4,4'-ethyleneglycol benzoate tetracarboxylic acid dianhydride, 4,4'-biphenylene-bis (trimellitic acid monoester anhydride), 1,4-naphthalene-bis (trimellitic acid monoester anhydride), 1,2-ethylene-bis (trimellitic acid monoester anhydride), 1,3-trimethylene-bis (trimellitic acid monoester anhydride), 1,4-tetramethylene-bis (trimellitic acid monoester anhydride), 1,5-pentamethylene-bis (trimellitic acid monoester anhydride), 1,6-hexamethylene-bis (trimellitic acid monoester anhydride) are named. These ester acid dianhydrides are used alone or in combination of two or more.

Further, diamine to be used in the present invention is aliphatic diamine or aromatic diamine represented by the general formula (2):

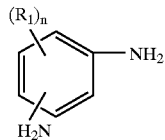
(2)

wherein $R_1$ represents alkyl, fluoro-alkyl, and alkoxyl groups or a halogen group, and n is an integer from 0 to 4. $R_1$ whose number is n may be the same or different; and/or diamine containing an aromatic diamine represented by the general formula (3):

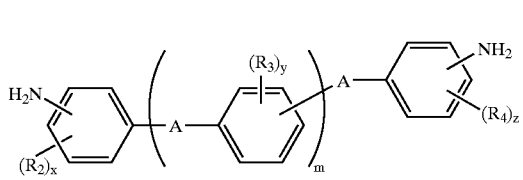
(3)

wherein A is any one of bond groups selected from the groups consisting of a single bond, —O—, —(CH$_2$)$_n$—, —CO—, —C(=O)O—, —NHCO—, —C(CH$_3$)$_2$—, —C(CF$_3$)$_2$—, —S—, or —SO$_2$—; $R_2$, $R_3$, and $R_4$ represent independently alkyl, fluoro-alkyl, alkoxyl groups or a halogen group, and are the same or different groups; x, y, z, m, and n are each an integer from 0 to 4; and A whose number is (m+1) may be the same or different.

These diamines may be used either alone or in combination of two or more.

Examples of aliphatic diamines include 1,2-diaminoethane, 1,3-diaminopentane, 1,3-diaminopropane, 1,4-diaminobutane, 1,5-diaminopentane, 1,6-diaminohexane, 1,7-diaminohepthane, 1,8-diaminooctane, 1,9-diaminononane, 1,10-diaminodecane, or the like.

Examples of aromatic diamines represented by the general formulae (2) and/or (3) include o-phenylenediamine, m-phenylenediamine, p-phenylenediamine, 2,4-toluenediamine, 3,3'-diaminodiphenyl ether, 3,4'-diaminophenyl ether, 4,4'-diaminophenyl ether, 3,3'-diaminodiphenylmethane, 3,4'-diaminodiphenyl methane, 4,4'-diaminodipheylmethane, 3,3'-diaminobenzophenone, 4,4'-diaminobenzophenone, 3,3'-diaminophenylsulfide, 4,4-diaminodiphenylsulfide, 1,3-bis (3-aminophenoxy) benzene, 1,4-bis (3-aminophenoxy) benzene, 1,4-bis (4-aminophenoxy) benzene, 2,2-bis (4-(3-aminophenoxy) phenyl)propane, 2,2-bis(4-(4-aminophenoxy) phenyl) propane, 4,4'-bis (p-aminophenoxy) sulfone, 3,4'-bis (p-aminophenoxy) diphenylsulfone, 3,3'-bis (p-aminophenoxy) diphenylsulfone, 4,4'-bis (4-aminophenoxy) biphenyl, or the like.

Aromatic diamines are more preferably used than aliphatic diamines in view of heat resistance, or the like as diamine components in the polyimide according to the present invention.

Further, aromatic diamines represented by the general formula (4) are preferably used:

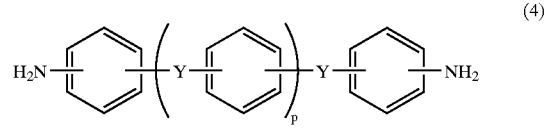
(4)

wherein Y is any one of bond groups selected from the groups consisting of a single bond, —CO—, —SO$_2$—, —O—, —S—, —(CH$_2$)$_q$—, —NHCO—, —C(CH$_3$)$_2$—, —C(CF$_3$)$_2$—, or —C(=O)O—. p and q are each an integer from 1 to 5.

A plurality of Y may be the same or two or more kinds of substituent groups in diamines represented by the general formula (4). In addition, hydrogen of each benzene ring may be substituted by various substituent groups as appropriate within the scope of the idea of the person in the art. Examples of the Substituent groups include methyl group, ethyl group, and halogen group such as Br and Cl, but these substitutent groups are not particularly limited.

Further, the diamines to be used for polyimide resins are siloxane diamines represented by the general formula (5) other than the above-mentioned diamines:

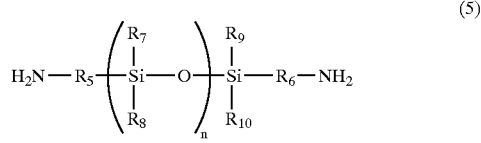
(5)

wherein $R_5$ and $R_6$ are each a divalent aliphatic group whose carbon number is from 1 to 4 or a divalent aromatic group, $R_7$, $R_8$, $R_9$, and $R_{10}$ are each a monovalent aliphatic group whose carbon number is from 1 to 4 or a monovalent aromatic group, n is an integer from 1 to 10.

More particularly, the diamines include α,ω-bis (3-aminopropyl) polydimethylsiloxane, $\overline{\omega}$, ω-bis (2-aminoethyl) polydimethylsiloxane, $\overline{\omega}$, ω-bis (3-aminopropyl) polydimethylsiloxane, $\overline{\omega}$, ω-bis (4-aminophenyl) polydimethylsiloxane, $\overline{\omega}$, $\overline{\omega}$-bis (4-amino-3-methylphenyl) polydimethylsiloxane, $\overline{\omega}$, $\overline{\omega}$-bis (3-aminopropyl) polydimethylsiloxan, or the like, but these are not particularly limited.

When siloxane diamine is mixed with the diamines to be used, each of the ratio of diamine is not particularly limited, however, the ratio of siloxane diamine to total diamines is within the range of 1 to 30 mole % is preferable. The polyimide resins containing siloxane diamine according to the present invention are easily handled when used as an adhesive because the solubility to a low boiling point solvent rises. When the ratio of siloxane diamine is less than 1 mole %, the solubility to a low boiling point solvent is poor. When the ratio is more than 30 mole %, heat resistance in the polyimide resin compositions obtained is poor.

Particularly, a bond of diamines represented by the general formula (4) and an amino group in the meta position represented by the following general formula (6) leads to improvement of the solubility to an organic solvent of the polyimide resins generated and excellent usefulness when used as an adhesive, and the like:

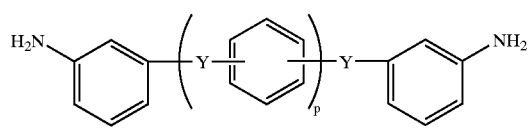

(6)

wherein Y is any one selected from the groups consisting of a single bond, —CO—, —SO$_2$—, —O—, —S—, —(CH$_2$)$_q$—, —NHCO—, —C(CH$_3$)$_2$—, —C(CF$_3$)$_2$—, or —C(=O)O—. p and q are each an integer from 1 to 5.

Diamines represented by the above general formula (4) and (6) may be used alone or in combination of two or more.

Ester acid dianhydrides represented by the general formula (1) are used as a comment in the polyimide resins according to the present invention:

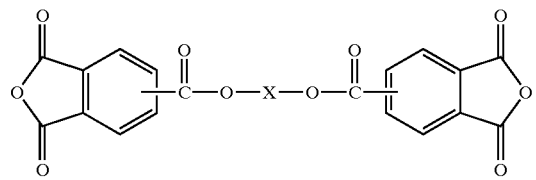

(1)

wherein X represents —(CH$_2$)$_k$—, or is a divalent group which comprises an aromatic ring, k is an integer from 1 to 10.

Tetracarboxylic acid dianhydrides containing 2,2′bis (4-hydroxyphenyl) propanedibenzoate-3,3′,4,4′-tetracarboxylic acid dianhydride (hereafter referred to as ESDA) represented by the following general formula (7) and diamines may be imidized to obtain:

acid dianhydrides including ESDA of 1 wt % or lower may be used for the polyimide resins of the present invention. The polyimide resins can be obtained by the imidization of diamines and tetracarboxylic acid dianhydrides containing ESDA which have preferably 1 wt % or lower of their residual impurities, more preferably 0.5 wt % or lower.

The residual impurities in the present invention mean any materials except tetracarboxylic acid dianhydride and mainly trimellitic anhydride or its derivatives. For example, the following compound (1):

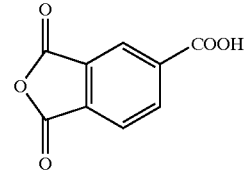

or the compound (2) is contained in the residual impurities:

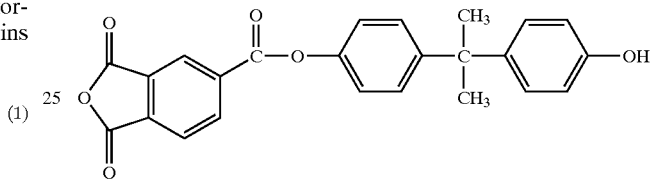

The residual impurities act as a polymer inhibitor when polyamic acid which is a polyimide precursor of polyimide is purified. Accordingly, when the content of the residual impurities contained in tetracarboxylic acid dianhydride or ESDA exceeds 1%, no sufficient degree of polymerization to form a polyimide film can be obtained because of increased polymer inhibitor actions, but a film which has few self-support properties and vulnerable can be obtained.

A method for limiting the content of the residual impurities contained in ESDA to 1% or lower includes a method for recrystallizing tetracarboxylic acid dianhydride or ESDA represented by the general formula (7) with a mixed solvent (Patent Publication No. 2-240074):

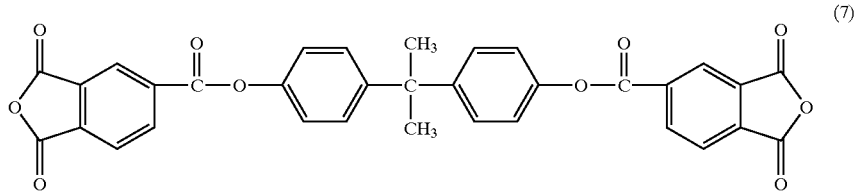

(7)

Furthermore, tetracarboxylic acid dianhydrides which contains residual impurities in the total of tetracarboxylic

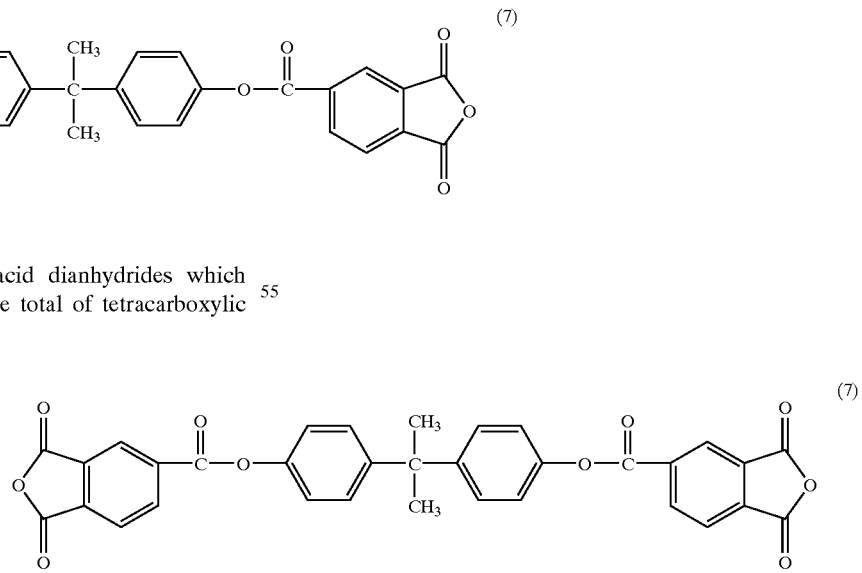

(7)

An explanation will be given to concrete methods using ESDA as an example, crude material 100 weight parts of ESDA, a solvent belonging to group (A), and a solvent belonging to group (B) or the range from 100 to 1000 weight parts of aliphatic anhydride are mixed to be dissolved by heating between 100° C. and 200° C. Continuously, ESDA crystals are detected by gradually cooling to the roan temperature. These crystals are filtered and separated by a known method and then dried to obtain ESDA having residual impurities of 1 wt % or lower.

A solvent belonging to group (A) and a solvent belonging to group (B) may be respectively used alone or in combination. Further, when aliphatic anhydrides are used for recrystallization, consecutive processing is also possible with a solvent belonging to the group (A) and/or a solvent belonging to the group (B).

The solvent belonging to the group (A) includes a hydrocarbon solvent which is inactive to ESDA and has ESDA solubility of 3 g/100 g or less at 25° C., more particularly, aromatic hydrocarbon, such as benzene, toluene, xylene, ethyl benzene, and isopropyl benzene, and aliphatic hydrocarbon, such as heptane, hexane, octane, and cyclohexane.

The solvent belonging to the group (B) includes a solvent which is inactive to ESDA and has ESDA solubility of 5 g/100 g or more at 25° C., more particularly, ketones, such as diisopropyl ketone, methylethyl ketone, acetylacetone, acetophenone, and cyclohexanone, and ethers, such as diisopropyl ether, ethylbutyl ether, and dichloroisopropyl ether, and esters, such as ethyl acetate, butyl acetate, cellosolve acetate, carbitol acetate, methyl aceto acetate, methyl propionate, methyl butyricate, and methyl phthalate.

An example of aliphatic anhydride includes acetic anhydride, but it is not limited.

The mixture ratio of the solvent belonging to the group (A) and the solvent belonging to the group (B) is selected within the range of (A):(B)=1:9 to 9:1.

ESDA and other tetracarboxylic acid dianhydride can be used in combination to the extent which does not deteriorate characteristics of polyimide.

Examples of tetracarboxylic acid dianhydrides to be used in combination include pyromellitic acid dianhydride, benzophenonetetracarboxylic acid dianhydride, biphenyltetracarboxylic acid dianhydride, diphenylethertetracarboxylic acid dianhydride, naphthalenetetracarboxylic acid dianhydride, and diphenylsulfonetetracarboxylic acid dianhydride, or the like. They may be used in combination of two or more together with ESDA. ESDA is contained 5 wt % or higher and 100 wt % or lower in total tetracarboxylic acid dianhydride, preferably contained 10 wt % or higher and 100 wt % or lower in total tetracarboxylic acid dianhydride. ESDA may be more preferably contained 30 wt % or higher and 100 wt % or lower in total tetracarboxylic acid dianhydride.

The polyimide resin of the present invention is obtained by dehydration and ring closure of a polyamic acid polymer as its precursor. The polyamic acid polymer is obtained by a substantial equimolar polymerization of ester acid dianhydride represented by the above formula (1) and one kind or more of diamine components represented by the above formula (2) and/or (3), particularly the formula (4) and/or (6) or (4). Polymerization is generally performed in an organic polar solvent. A substantial equimolar herein means that the ratio between dianhydride and diamine is within the range of 0.98:1 to 1.02:1.

To synthesize a polyimide resin, a polymerization is performed preferably in the inactive atmosphere, such as argon gas, nitrogen gas by dissolving on diffusing at least one kind of diamine component represented by the above-mentioned general formula (2) and/or (3), particularly the general formula (4) and/or (6) and a dianhydride selected from ester acid dianhydride represented by the general formula (1) in an organic polar solvent or diffused to obtain a solution of a polyamic acid polymer. "Dissolving" herein includes a case wherein the solute is in the same status to be substantially dissolved by being evenly dispersed or diffused in a solvent in addition to the case the solute is perfectly dissolved in the solvent.

The order of addition of each monomer when the above mentioned polyamic acid polymer is polymerized may be that a dianhydride is previously added in the organic polar solvents and then the diamine component may be added. Further, a part of diamine component may be first added in the organic polar solvent as appropriate and the next, a dianhydride may be added, and further the reminder of the diamine component may be added to obtain a solution of a polyamic acid polymer. Any other variety of addition methods which are known to those skilled in the art may be used.

An organic polar solvent is preferably used when a polyamic acid polymer is synthesized. Concrete examples of organic polar solvents include, for example: sulfoxide solvents, such as dimethyl sulfoxide, diethyl sulfoxide, formamide solvents, such as N,N-dimethylformamide, and N,N-diethylformamide, acetamide solvents, such as N,N-dimethylacetamide and N,N-diethylacetamide, a pyrrolidone solvent, such as N-methyl-2-pyrrolidone, phenol solvents, such as phenol, o-, m-, or p-cresol, xylenol, halogenated phenols, and catechol, or hexamethylphospholamide, γ-butylolactone, or the like. These organic polar solvents and aromatic hydrocarbon, such as xylene or toluene can also be used in combination as necessary.

The polyamic acid polymer obtained in this manner is dehydrated for ring closure, for example, by a thermal or chemical method to afford the polyimide resin of the present invention. The imidization methods include, for example, the thermal imidization to dehydrate the polyamic acid solution by heat treatment and the chemical imidization to dehydrate the solution by a dehydrating agent. Either of them may be used.

The method for thermally dehydrating for ring closure is achieved by evaporating the solvent of the above-mentioned polyamic acid solution. Further, the method for chemically dehydrating for ring closure is achieved by adding a dehydrating agent and a catalyst in amounts not smaller than the stoichiometric amounts to the above-mentioned polyamic acid polymer and evaporating an organic solvent. It is preferable to evaporate the organic solvent under temperature conditions of 160° C. or lower within the range of time for about 5 to 90 minutes. Furthermore, the heating temperature is selected within the range between room temperature and about 250° C. as appropriate. Imidization may be carried out at room temperature. Gradual heating is preferable. Examples of dehydrating agents to be used when a chemical method is carried out include: aliphatic anhydride such as acetic anhydride, and aromatic anhydride. And examples of catalysts include: aliphatic tertiary amines, such as triethyl amine, aromatic tertiary amines, such as heterocyclic tertiary amines, such as pyridine and isoquinoline.

Thermal imidization and chemical imidization may be used in combination.

The polyimide resin of the present invention obtained in this manner has low water absorption and the glass transition temperature at a relatively low temperature. Specifically, it is preferable to have the glass transition temperature from 100° C. to 250° C., a water absorption factor of 1.5% or lower, and a dielectric constant of 3.2 or lower because of excellent workability, durability, and insulation properties.

The glass transition temperature of 100° C. or lower is not preferable because of poor heat resistance. In addition, the glass transition temperature of 250° C. or higher is not preferable because of high working temperature in view of workability. Since the glass transition temperature of the polyimide resin of the present invention is within the range of 100° C. to 250° C., a lamination of the polyimide resin at a temperature close to this temperature range makes it possible to be dissolved. In addition, the polyimide resin may be preferably used within this temperature range from the viewpoint of easy curing of a thermosetting resin. The polyimide resin may be more preferably used within the range of 100° C. to 200° C.

Although the polyimide resin having water absorption of over 1.5% is not preferable because it may have swelling, the polyimide resin according to the present invention having water absorption of 1.5% or lower is preferable from the viewpoint of little deterioration of a film function caused by absorption of water. More preferably, the polyimide resin has water absorption of 1.3% or lower, particularly preferable is 1.0% or lower.

Further, the polyimide resin having a dielectric constant of over 3.2 is not preferable because it is poor in insulation properties, but the polyimide resin according to the present invention is preferable because its dielectric constant can be 3.2 or lower from the viewpoint of few dielectric loss when coating the wire rod to pass electric current. More preferably, it is 3.0 or lower.

Further, to improve adhesion properties, a silane coupling agent and a nonionic surface active agent, or the like may be added to the polyimide resin according to the present invention as appropriate.

Exemplary silane coupling agents to be used include: vinyltrichlorosilane, vinyltriethoxysilane, metaachroxypropyltrimethoxysilane, or the like. The compounded amount is from 0.01 to 5 wt % to the total amount of the polyimide resin. Exemplary titanic coupling agents include: isopropyl triisostearoyltitanate and isopropyltridecylbenzenesulfonyltitanate, or the like. The compounded amount is within the range of 0.01 to 5 wt % to the total amount of the polyimide resin.

Exemplary nonionic surface active agents include: fatty acid monoglycerin ester, aliphatic polyglycol ester, and aliphatic alkanolamide, or the like. The compounded amount is 0.01 to 5 wt % to the total amount of the polyimide resin.

Next, the resin composition of the present invention is to be one of structure components which comprise the above-mentioned polyimide resin. Therefore, when the resin composition of the present invention is cured, in a preferred embodiment, it becomes possible to have very low water absorption of 1.5% or lower, more preferably, 1.3% or lower, 1.0% or lower is particularly preferable. Further, when the resin composition is cured, the use of epoxy resin makes it possible to provide excellent adhesion in addition to polyimide resin's excellent heat resistance and low water absorption.

The resin composition of the present invention can be obtained by evenly mixing by stirring the polyimide resin to be obtained in the above-mentioned manner and thermoplastic resin, such as epoxy resin and a curing agent, and other components. In the resin composition of the present invention, particularly, with the use of epoxy resin, further excellent adhesion in addition can be provided to characteristics of the polyimide resin to be used in the present invention.

Bismaleimide, bisarylnadiimide, phenol resin, and cyanate resin, or the like may be used as thermoplastic resin to be used herein, but an epoxy resin is particularly preferred to be used in view of the balance of its characteristics. An arbitrary epoxy resin is usable in the present invention. For example, bisphenol epoxy resins, halogenated bisphenol epoxy resins, phenolnovolak epoxy resins, halogenated phenolnovolak resins, arkylphenolnovolak epoxy resins, polyphenol epoxy resins, polyglycol epoxy resins, alicyclic epoxy resins, cresolnovolak epoxy resins, glycidylamine epoxy resins, urethane denatured epoxy resins, rubber denatured epoxy resins, and epoxy denatured polysiloxane, or the like can be used. Specifically, the examples include: Bisphenol A-type resins, such as Epikote 828 (manufactured by Shell International Chemicals Corporation), orthocrezol novolak resins, such as 180S65 (manufactured by Shell International Chemicals Corporation), Bisphenol-A novolak resins, such as 157S70 (manufactured by Shell International Chemicals Corporation), trishydroxyphenyl methane novolak resins, such as 1032H60 (manufactured by Shell International Chemicals Corporation), naphthalene aralkyl novolak resins, such as ESN375, tetraphenolethane 1031S (manufactured by Shell International Chemicals Corporation), YGD414S (Tohto Chemicals Corporation), trishydroxyphenyl methane EPPN502H (Nippon Kayaku Co., Ltd.), special Bisphenol VG3101L (Mitsui Chemicals, Inc.), special naphthol NC7000 (Nippon Kayaku Co., Ltd.), and glycidylamine type resins, such as TETRAD-X and TETRAD-C (Mitsubishi Gas Chemical Co., Inc.), or the like, the resins which include two or more epoxy groups are particularly preferable because of excellent reaction. The resins having epoxy equivalent of 250 or less are preferable because of enhancement of its adhesion properties. Epoxy resins may be used in combination with thermoplastic resins, such as phenol resins, cyanate resins, and the like. The epoxy equivalent is obtained by dividing the molecular weight of the epoxy resins by the number of epoxy groups.

The mixture ratio of thermosetting resins, particularly epoxy resins are from 1 to 50 weight parts to 100 weight parts of polyimide which is a thermoplastic resin, the weight parts from 5 to 30 are preferably added. When the weight parts are too few, the adhesive strength is low, but when they are too many, they are poor in flexibility, heat and radiation resistance as well.

The resin composition of the present invention may be used in combination of an epoxy curing agent, such as a dianhydride type, amine-type, and imidazole type, an accelerator, or various types of coupling agents, as well as the above mentioned thermosetting resins in accordance with demands for improving absorption, heat resistance, and adhesion properties, or the like may be used in combination.

In the present invention, the polyimide resin contained as one of embodiments in the resin composition may be amine-terminated polyimide oligomer.

The amine-terminated polyimide oligomer can be obtained by dehydrating polyamic acid oligomer having amine terminal which is a precursor for ring closure. The amine-terminated polyamic acid oligomer can be obtained by polymerizing ester acid dianhydride represented by the above formula (1) and at least one kind of diamine component represented by the above formula (4) and/or (6) by a mixture which becomes substantially an excess. Preferably, the polyamic acid oligomer can be obtained, for example, by the polymerization of a 1-mole ester acid dianhydride and from 1.02 to 1.1 mole of a diamine component. The polymerization is ordinarily performed in an organic polar solvent.

To synthesize the polyimide oligomer, in the inactive atmosphere, such as argon gas and nitrogen gas, at least one kind of diamine represented by the formula (4) and/or (6), and a dianhydride selected from ester acid dianhydride represented by the formula (1) are dissolved or diffused in the organic polar solvent to perform a polymerization and then the polyamic acid oligomer solution can be obtained. The synthesis process may be carried out by the similar method as the polyimide resin according to the present invention.

The polyimide oligomer preferably has a number average molecular weight of 2,000 to 50,000, more preferably 3,000 to 40,000, and further preferably 5,000 to 30,000. If the molecular weight is 2,000 or greater, mechanical strength required for curing substances obtained by curing the composition will be retained. Further, if the polyimide oligomer having an amino group as a terminal has the number average of molecular weight of smaller than 50,000, the amount of amino group to be a reaction point with epoxy resin is relatively suitable for an epoxy group and has appropriate bridge density, so that it has stability from the viewpoint of structure because of no empty parts. This leads to prevent the penetration of solvents, so that peeling strength retention after conducting a PCT (Pressure Cooker Test), which is a reliability test for electronic materials, can be improved.

Thus-obtained amino group of amine-terminated polyimide oligomer and epoxy group of epoxy resin are bridged by a chemical reaction to generate a new chemical bond at multi-points. Polyimide oligomer, therefore, exerts the similar reaction effect to a curing agent of epoxy resin to increase the bridge density and decrease water absorption. Additionally, the polyimide oligomer part that is not reactive to epoxy resin has a relatively low glass transition temperature, so that it enables low water absorption and law temperature adhesion as a whole. The amine-terminated polyimide oligomer is characterized in that it may be chemically bonded to epoxy resin. In the resin composition of the present invention, the amine terminal may be chemically bonded to epoxy resin, or may not be bonded to epoxy resin. The effects of the present invention can be obtained, if only the chemical bond between the amine terminal of polyimide oligomer and epoxy resin is formed before the resin composition for adhesion is finally cured. Accordingly, in the resin composition of the present invention before curing, the effects of the present invention can be obtained regardless of whether or not the amine terminal of the polyimide oligomer is chemically bonded to epoxy resin.

For example, when the resin composition is used as a flexible copper clad laminate, there is an advantage that a chemical bond between an amine terminal of the polyimide oligomer and the epoxy resin results in little penetration of solvents because of its elaborate structure having multiple cross-linking points. For example, the peeling strength retention after the PCr (Pressure Cooker Test), which is a reliability test for electronic materials, can bring about a high retention, such as preferably 60% or greater, more preferably 70% or greater, further preferably 80% or greater.

In another preferable embodiment of the resin composition in the present invention, the residual volatile component of an organic solvent included after curing the resin composition may contain 3 wt % or lower. One kind or at least two kinds of solvents included in the resin composition of the present invention are not particularly limited, if only they dissolve a polyimide and an epoxy resin, but they are limited to the kind and amount that may limit the residual volatile component to 3 wt % or lower. Further, the solvents having a low boiling point at 160° C. or lower is preferable from the viewpoint of economics and workability. Additionally, "solvents having a low boiling point" herein mean the solvents having a boiling point at 160° C. or lower. The solvents have preferably a boiling point at 130° C. or lower, more preferably at 105° C. or lower. These solvents having a low boiling point preferably include: tetrahydrofuran (hereinafter referred to as THF. Boiling point: 66° C.), 1,4-dioxane (hereinafter referred to as dioxane. Boiling point: 103° C.), 1,2-dimethoxyethane モノグライム boiling point 84° C.). They may be used alone or may be used in combination of two kinds or more.

The residual volatile component in the curing substance which was obtained by curing the resin composition may be 3 wt % or lower, preferably 2 wt % or lower, and the component may be particularly preferable to be 1 wt % or lower.

The residual volatile component may be easily measured, for example, by the gas chromatography method, or the like. A curing substance to measure the residual volatile component is prepared as mentioned below. An adhesive is cast onto a glass plate. After drying at 100° C. for 10 minutes, the adhesive is peeled off from the glass plate to set on a steel frame, and a sheet having a thickness of 25 μm is obtained after drying at 150° C. for 20 minutes. The obtained sheet is sandwiched between a polyimide film (Apical 50AH, manufactured by Kaneka Corporation) and a copper foil of 25 μm thickness, and a flexible copper clad laminate is obtained after giving pressure by heating at 200° C. under a pressure of 3 Mpa for 20 minutes. The cured adhesive within this laminate is dissolved with a solvent different from the solvents within the cured adhesive to prepare a sample of certain concentration (for example, 5 wt %). And then the weight of the residual volatile component can be measured using a detector such as FID by vaporizing in the carrier gas. Solvents, which are estimated to be contained in he residual volatile component, are solved in the other solvent to be prepared solutions in various concentrations. Each solution is vaporized in the carrier gas within a column for gas chromatography. A calibration curve is created. And then the weight of the residual volatile component can lead to an easy measurement according to the detector such as FID is made.

The residual volatile component in the curing substance which was obtained by curing the resin composition is reduced to be 3 wt % or lower, preferably 2 wt % or lower, and particularly preferable to be 1 wt % or lower. This leads to excellent adhesion when using the resin composition as an adhesive, for example, as a flexible copper laminated plate. For example, it becomes possible to attain a high peeling strength retention, preferably 60% or greater, more preferably 70% or greater, further preferably 80% or greater after conducting a PCT (Pressure Cooker Test) which is a reliability test for electronic materials.

Adjusting the mixture of the resin composition allows the water absorption of the resin composition to be easily adjusted by those skilled in the art. In a preferred embodiment, the water absorption of the curing substance obtained by the composition of the present invention is 1.5% or lower.

Moreover, the resin curing substance to measure the water absorption is prepared as mentioned below. An adhesive is cast onto a glass plate. After drying at 100° C. for 10 minutes, the adhesive is peeled off from the glass plate to set on a steel frame, and a sheet having a thickness of 25 μm is obtained after drying at 150° C. for 20 minutes. The obtained sheet is sandwiched between a polyimide film (Apical 50AH, manufactured by Kaneka Corporation) and a copper foil of 25 μm thickness, and a flexible copper clad laminate is obtained after giving pressure by heating at 200° C. under a pressure of 3 MPa for 20 minutes. The water absorption of the cured adhesive within the laminate may be measured in an arbitrary method in the publicly known art. For example, it can be calculated by, for example, measurement based on ASTM D570.

The resin composition according to the present invention is not limited in its producing method and timing of mixing each component. More specifically, a resin solution which comprises a thermoplastic polyimide and a thermosetting resin may be obtained by adding the thermosetting resin as it is to the thermoplastic polyimide solution. Or the resin solution may be adjusted by adding a low boiling point solvent to the thermoplastic polyimide solution and further adding a thermosetting resin to be stirred for mixing. The resin composition of the present invention may be obtained by throwing a polyimide solution into a poor solvent used at the time of polymerization of polyamic acid to remove a non-reacted monomer by depositing the polyimide resin to be dried, and then drying to obtain a solid polyimide resin as well. Although the poor solvent dissolves the solvent well, the polyimide has an attribute to be difficult to be dissolved. Typical examples are acetone, methanol, ethanol, isopropanol, benzene, methyl cellsolve, methyl ethyl ketone, or the like, which are not limited.

In addition, it is not particularly limited that the solid-state thermoplastic polyimide resin purified as described above may be converted in a filter refined varnish state by dissolving again this purified polyimide resin together with the above thermosetting resin in an organic solvent when being used. The organic solvent used at this time is not particularly limited and any known organic solvents that those skilled in the art can be used.

In the conventional polyimide-type adhesive, while its adhesion was not strong enough for metals such as a copper foil and resin films such as polyimide, and the mixture with an epoxy resin was difficult due to its limited solubility, in the resin composition of the present invention, its adhesion with metal foils such as a copper foil or polyimide films is superior. Further, the resin composition of the present invention has superior workability because of having superior solubility in organic solvents. Furthermore, such superior solubility in organic solvents leads to properties such as adhesiveness at a low temperature. More specifically, thee resin composition has an excellent low water absorption of 1.5% or lower, preferably 1.3% or lower, further preferably 1.0% or lower, and it can be bonded as an adhesive at the temperature of about 250° C. or lower due to its excellent solder heat resistance and heat resistance, as well as excellent adhesion. Accordingly, the resin composition has superior workability. For example, the polyimide and epoxy resin solutions obtained by imidization of a polyamic acid polymer can be used in a sheet state directly. For example, the resin composition can be used as it is as a printed circuit board, or the like. Moreover, it has properties preferably used for electronics, particularly, a flexible printed circuit board, a tape for TAB, a composite lead frame, lamination materials, or the like as a lamination material.

When an amine-terminated polyimide oligomer is used as a polyimide, the composition of the present invention has a sophisticated or elaborate structure having multiple cross-linking points in the resin composition so that the amine termination may be chemically bonded to the epoxy resin, which results in few permeation of the solvent. As a result, it becomes possible to attain a high peeling strength retention, preferably 60% or greater, more preferably 70% or greater, further preferably 80% or greater after conducting a PCT (Pressure Cooker Test) which is a reliability test for electronic materials. Moreover, the composition has excellent solder heat resistance, as well as excellent heat resistance and adhesion, and when it is used as an adhesive, a composition which can be bonded at a relatively low temperature, for example, not higher than about 250° C. is provided.

Next, the polyimide-type adhesive solution according to the present invention is obtained by dissolving the obtained thermo-plastic polyimide resin of the present invention and the above-mentioned epoxy resin and curing agent in an organic solvent, but particularly, the polyimide-type adhesive solution of the present invention using an organic solvent including cyclic ether solvent has strong adhesion when used for laminating layers because the solvent can be removed by drying at a relatively low temperature.

Tetrahydrofuran (THF), 1,4-dioxane, and dioxolane may be preferably used as cyclic ether solvents. Further, when a mixed organic solvent prepared by mixing a plurality of solvents is used, it is desirable to combine the organic solvent with a polar organic solvent. The effects of the present invention, however, appear more easily when including a cyclic ether solvent of 30 wt % or higher, preferably 50 wt % or higher. Among organic polar solvents in combination with a cyclic ether solvent are sulfoxide-type solvents, such as diethyl sulfoxide and diethyl sulfoxide, formamide-type solvents, such as N, N-dimethylformamide and N,N-diethyl formamide, and acetamide-type solvents, such as N,N-dimethyl acetamide and N,N-diethyl acetamide.

The thermoplastic polyimide resin used for the adhesive solution of the present invention is characterized in that 50 mole % or more of dianhydride residue contained in the particle is an ester acid dianhydride residue represented by the general formula (1):

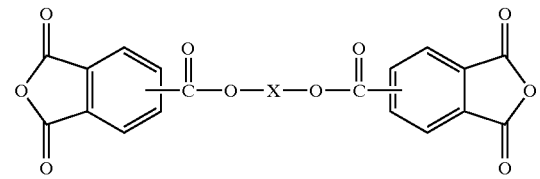

Wherein X represents —$(CH_2)_k$—, or is a divalent group which comprises an aromatic ring, k is an integer from 1 to 10. It has excellent solubility in the above organic solvent because of its structure.

Preferable examples of anhydrides represented by the general formula (1) are 2,2-bis (4-hydroxyphenyl) propanedibenzoate-3,3',4,4'-tetracarboxylic acid anhydride, p-phenylenebis (trimellitic acid monoester anhydride), 4,4'-biphenylene-bis (trimellitic acid monoester anhydride), 1,4-naphthalene-bis (trimellitic acid monoester anhydride), 1,2-ethylene-bis (trimellitic acid monoester anhydride), 1,3-trimethylene-bis (trimellitic acid monoester anhydride), 1,4-tetramethylene-bis (trimellitic acid monoester anhydride), 1-5-pentamethylene-bis (trimellitic acid monoester anhydride), 1,6-hexamethylene-bis (trimellitic acid monoester anhydride), or the like. However, 2,2-bis (4-hydroxyphenyl) propanedibenzoate-3,3',4,4'-tetracarboxylic acid dianhydride represented by the general formula (7) is particularly preferable:

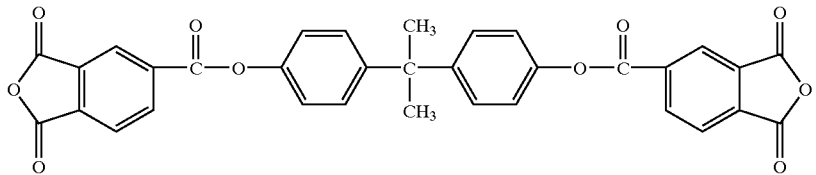

Moreover, diamine components to allow to react with the above dianhydride are not limited, if only they are diamines used for the above polyimide resin, but a diamine compound, particularly bis(aminophenoxyphenyl) sulfone represented by the general formula (4) is preferable:

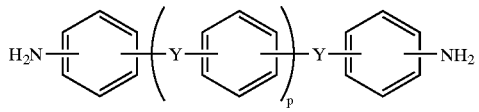

wherein Y is any one selected from the groups represented by a single bond, —CO—, —SO$_2$—, —O—, —S—, —(CH$_2$)$_q$—, —NHCO—, —C(CH$_3$)$_2$—, —C(CF$_3$)$_2$—, and —C(=O)O—. p and q are each an integer from 1 to 5.

Furthermore, in the general formula (4), a plurality of Y may be the same or different between each of repeating units, and hydrogen of each benzene ring may be substituted by various types of substituted groups as appropriate within the scope of the idea of the person in the art. Typical examples are methyl group, ethyl group, hydrocarbon group, and halogen group such as Br and Cl, but these substituent groups are not particularly limited. In addition, since the thermoplastic polyimide containing diamine compounds has superior solubility in an organic solvent, an adhesive solution which is superior in workability is preferably obtained from the diamine compound represented by the general formula (6) having an amino group in the meta position out of the diamine compounds represented by the general formula (4). The diamine compounds represented by the general formula (4) may be used in combination of two or more kinds.

Polyamic resins obtained from the above-mentioned diamine compounds and ester acid dianhydrides are soluble to the organic solvents including the above-mentioned cyclic ether solvents which are insoluble or slightly dissolved to most of conventional thermoplastic polyimides.

The polyimide-type adhesive solution according to the present invention dissolves the above polyimide resin and the above epoxy resin in the organic solvent including the above cyclic ether solvent. The mixture ratio of epoxy resins is from 1 to 50 weight parts to 100 weight parts of polyimide which is a thermoplastic resin, the weight parts from 5 to 30 are preferably added. When the weight parts are too few, the adhesive strength is low, but when they, are too many, they are poor in flexibility, heat resistance and radiation resistance as well.

Other curing agents, accelerators, or various types of coupling agents may be used in combination. The concentration of the adhesive solution is from 5 to 50 wt % to the solid component whose denominator is the solution weight (thermoplastic polyimide+epoxy resin+curing agent), preferably from 10 to 40 wt %, from 15 to 30 wt % is particularly preferred. Procedures of dissolution may be decided as appropriate in view of workability, and the like.

Next, one of embodiments of the joining component in a film state according to the present invention is that the thermosetting resin is obtained by laminating the thermosetting resin onto one side or both sides of a base film which comprises the above obtained thermoplastic polyimide resin to dry by heating. Or after removing the solvent by casting the above thermosetting resin on a support to be,a sheet, the joining component in a film state can be obtained by attaching the resin to the base film which comprises the thermoplastic polyimide resin.

Furthermore, the thickness of the thermosetting resin laminated on the above polyimide film is preferably within the range of 0.5 to 5 μm, more preferably within the range of 0.5 to 3 μm. When the thickness is 0.5 μm or less, its adhesion is not strong enough, and when the thickness is 5 μm or more, its mechanical strength is weak, so that the film becomes brittle.

The other embodiment of the film-state joining component according to the present invention can be obtained by laminating the resin composition prepared by evenly mixing with stirring a thermoplastic polyimide resin, a thermosetting resin, and the other components of the surface of the polyimide film on one side or both sides. Specifically, the resin composition solution comprising the thermoplastic polyimide and the thermosetting resin used in the present invention, is obtained by dissolving the thermoplastic polyimide in a solvent to be a polyimide resin solution, and then adding the thermoplastic polyimide and the other components, and is applied onto the polyimide film by being dried. Or the resin composition solution obtained in such a manner is applied by flow casting on a support, and the solution may be laminated to the polyimide film as well after removing the solvent to be a sheet.

Generally known Apical, Kapton, Uplex, and the like may be used for a polyimide film for laminating a resin composition layer, but they are not limited. The thickness of the polyimide film may be selected as appropriate when used. Further the thickness of the resin composition layer which comprises a thermoplastic polyimide and a thermosetting resin laminated on the above polyimide film may be selected as appropriate in accordance with needs when used, but the thickness is preferably within the range of 5 to 30 μm. When the thickness is too thin, its adhesion may be deteriorated, but when the thickness is too thick, it may cause difficulties in removing the organic solvent by drying, which leads to foaming.

The bonding conditions of the joining component in a film state of the present invention may be enough, if only the joining component can be sufficiently bonded and cured. For one example, the component may be heated at a temperature from 150 to 250° C. under a pressure from 0.1 to 10 MPa for 5 to 20 minutes.

The film-state joining component according to the present invention may be used, for example, when metal foils, such as a copper foil, an aluminum foil, 42 alloy, the other film, and a printed circuit board, and the like are bonded by heating and giving pressure. The kind of the other film is not particularly limited, and for example, a polyimide film and a polyester film, and the like are used. Moreover, the bonding conditions in this case are not particularly limited, if only the conditions are good enough for the film to be bonded and cured. More particularly, it is preferable to heat at a temperature from 150 to 250° C. under a pressure from 0.1 to 10 MPa for 5 to 20 minutes, but the preferred embodiment is not limited to these conditions. As described above, the film-state joining component of the present invention is preferably used for a flexible printed circuit board, a tape for TAB (Tape automated bonding), a composite lead frame, and lamination materials, or the like. Since the film-state joining component according to the present invention has superior properties, such as workability at a low temperature, flexibility, and radiation resistance, the joining component can be used as an adhesive laminate film for wire rod coating, particularly suitable for a wire rod coating for superconductivity.

The adhesive laminate film for wire rod coating according to the present invention is constructed by depositing a bonded layer which comprises a thermosetting resin and the above obtained thermoplastic polyimide resin film onto a polyimide film. Generally known Apical, Capton, and Uplex, and the like may be used for the polyimide film on which the bonded layer is laminated, but they are not limited. Further, the polyimide film has a thickness within the range of 5 to 300 μm, preferably within the range of 10 to 125 μm.

The bonded layer which comprises 4 thermoplastic polyimide and a thermosetting resin laminated on the above polyimide film has a thickness within the range of 1 to 20 μm, preferably within the range of 3 to 10 μm.

Next, a method for obtaining the adhesive laminate film for wire rod coating is, for example, to apply the film-like resin composition of the present invention, which comprises the thermoplastic polyimide resin obtained as described above and the thermosetting resin, onto the other polyimide film and perform thermocompression bonding.

In addition, the adhesive laminate film for wire rod coating may be obtained by overlapping the thermoplastic polyimide resin and the film-state thermosetting resin of the present invention formed with a sheet of released paper to perform thermo compression bonding, and the released paper maybe peeled off when used.

Further, the desired adhesive laminate film for wire rod coating may be produced by casting the solution of the resin composition of the present invention which comprises a thermoplastic polyimide and a thermosetting resin in an organic solution, particularly the adhesive solution of the present invention, directly onto a polyimide film and drying.

The obtained adhesive laminate film for wire rod coating according to the present invention is provided for coating the wire rod, for example, is subsequently rolled up, or rolled up after a film as a spacer, such as polyethylene terephthalate, polypropylene, and polyethylene, is disposed on its the bonded layer side.

Figure 3:
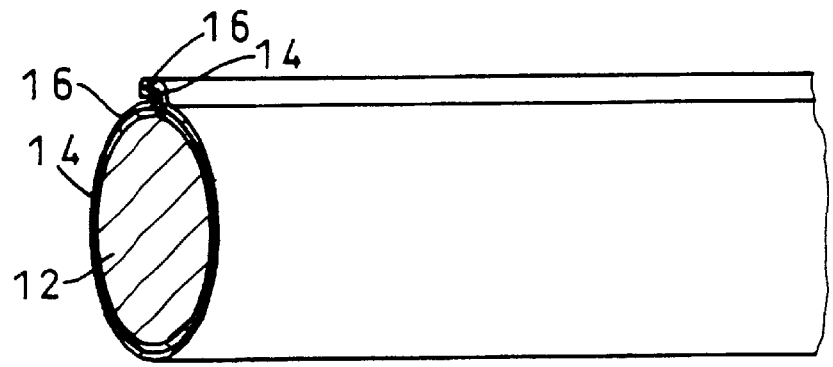
FIG. 3 is a perspective illustration view to explain still another method for coating a wire rod with an adhesive laminate film for wire rod coating according to the present invention.

Such coating of the adhesive laminate film for wire rod coating is performed by selecting as appropriate from methods usually performed. Examples are as mentioned below. For example, as shown in FIG. 1, after an adhesive laminate film for wire rod coating 10 with a particular width is wrapped around the rim of a wire rod 12 in a spiral state so that both ends of the laminate film 10 may be overlapped, heat at a predetermined temperature to bond a polyimide film 16 to the wire rod 12 via a bonded layer 14. Or as shown in FIG. 21, the adhesive laminate film 10 may be wrapped around the wire rod 12 to keep both edges of the laminate film 10 from overlapping. Moreover, as shown in FIG. 3, it is also possible to form the laminate film 10 having a width which is slightly longer than the rim of the wire rod 12 to wrap the laminate film 10 along the wire rod 12 with the ends being bonded or pressed.

Figure 4:
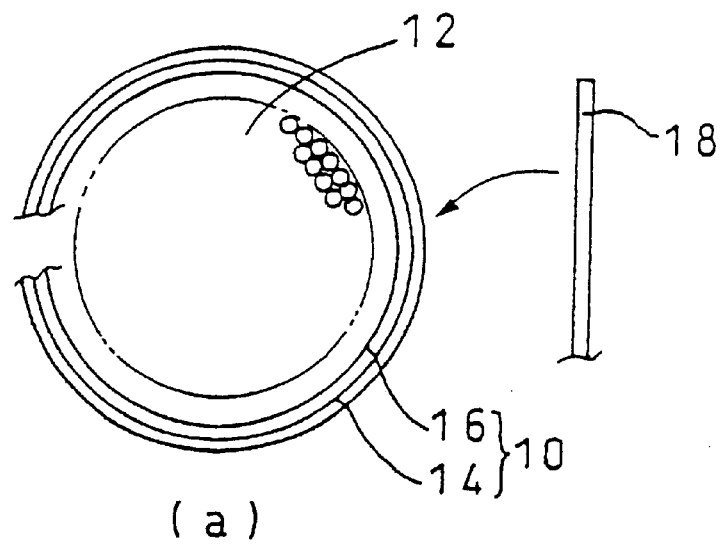
FIGS. 4(a) and 4(b) are perspective illustration views to respectively explain a further method for coating a wire rod with an adhesive laminate film for wire rod coating according to the present invention.
Figure 4:
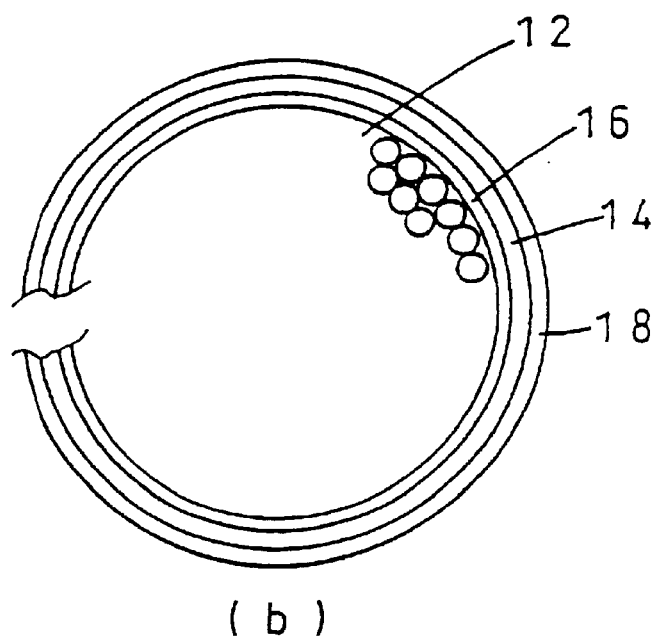

As shown in FIG. 4(a), the laminate film 10 is wrapped around the rim of the wire rod 12 with the bonded layer 14 outside, and the other film 18 without adhesion is further wrapped on the outside with the ends of the film 18 overlapped slightly or kept a space between them. And then the bonded layer 14 is fused by heating under a pressure, as well as bonding the polyimide film 16 in the overlapped portion of the ends of the laminate film 10, the other film 18 wrapped outside may be bonded to the boned layer 14. According to such method, as shown in FIG. 4(b), the laminate film of the present invention is bonded to the other film 18 to be formed in a tube state, so that the laminate film 10 can be coated on the rim of the wire rod 12 without a close contact with the wire rod 12. This structure is adopted, there is no deterioration of the wire rod when the film is coated on the wire rod, but superior properties suitable for the wire rod, such as flexibility, adhesion, and workability are recognized, which are preferable. Further, the film 18 may be the same or different from the above-mentioned polyimide 16 which comprises the laminate film 10 of the present invention.

Figure 5:
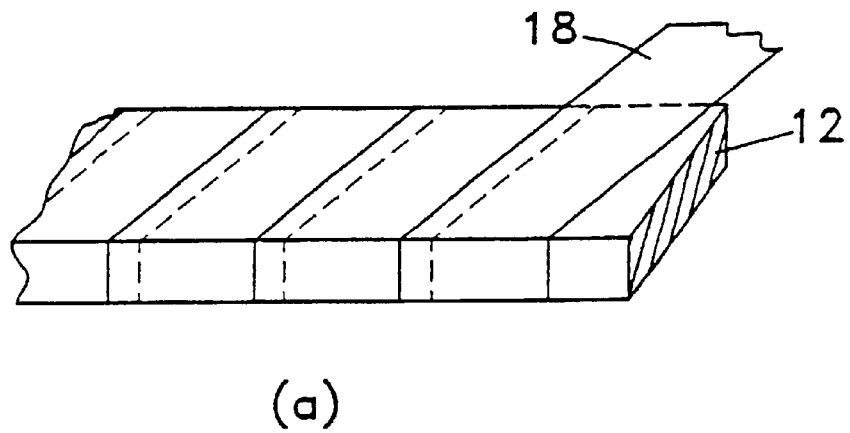
FIGS. 5(a) and (b) are perspective illustration views to respectively explain a still further method for coating a wire rod with an adhesive laminate film for wire rod coating according to the present invention.
Figure 5:
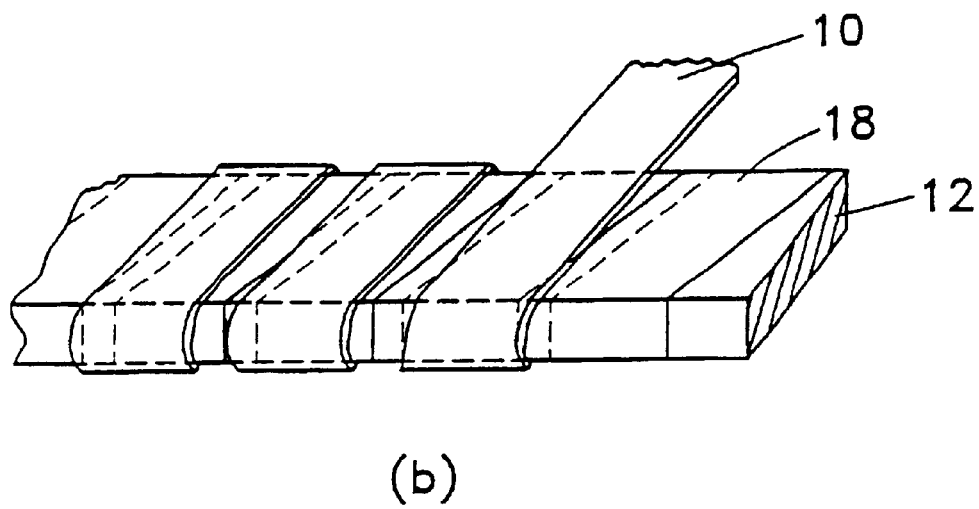
Figure 6:
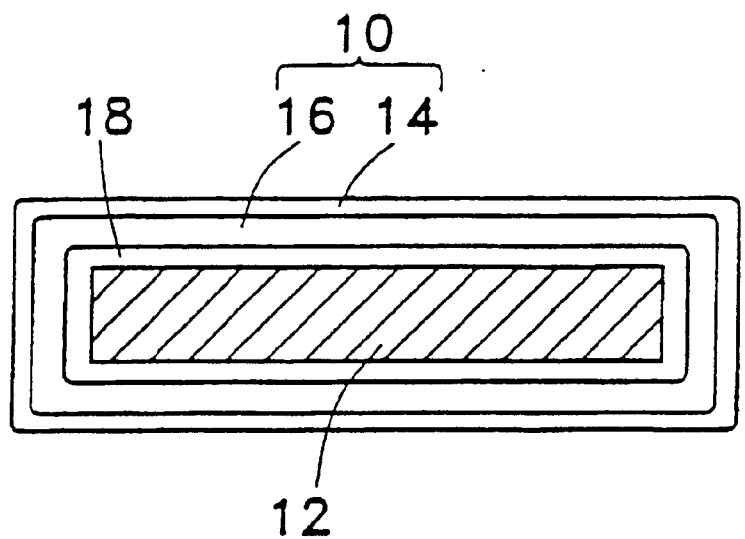
FIG. 6 is a cross-sectional view of the adhesive laminate film for wire rod coating after coating a wire rod according to the present invention shown in FIG. 5.
Figure 7:
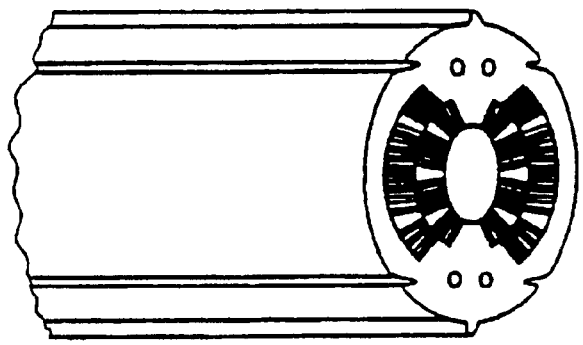
FIG. 7 is a perspective illustration view to explain an adaptive example for particle accelerations of a wire rod coated with the adhesive laminate film according to the present invention shown in FIGS. 5 to 6.

In addition, the adhesive laminate film for wire rod coating of the present invention may be, as shown in FIGS. 5 through 7, particularly used for an accelerator. For example, as shown in FIG. 5(a), the polyimide film 18 with a given width is wrapped around in the rim of a super conductivity wire rod for accelerator 12 with its ends being overlapped. Besides, as shown in FIG. 5(b), the adhesive laminate film 10 with a given width of the present invention is wrapped around in a spiral with the bonded layer 14 disposed outside and spaced at both ends. FIG. 6 shows its cross section. A plurality of coated wire rods are subsequently heated to a predetermined temperature to bond between the superconductivity wire rods via the bonded layer 14. The wire rods coated with this adhesive laminate film for wire rod coating may be used for an accelerator in the embodiment as shown in FIG. 7.

The adhesive laminate film for wire rod coating according to the present invention have easy handling and workability by previously using a prepared laminate of the other polyimide film and an adhesive layer, which leads to an improvement of productivity.

Further, the adhesive film which comprises a thermoplastic polyimide and a thermosetting resin used as an adhesive layer in the present invention may be used as an insulating coating material, and the adhesive film may also be used in peeling off a sheet of released paper after wrapping a resin film which comprises a film-like thermoplastic polyimide and a thermosetting resin and the released paper around the wire rod by overlapping in twofold and, performing thermo compression bonding.

Furthermore, an adhesive film constructed by a thermoplastic resin and a thermosetting resin, and a substance made by overlapping the other available polyimide film such as Apical (manufactured by Kaneka Corporation) are wrapped around the wire rod and directly crimped by heating to be coated.

The adhesive laminate film for wire rod coating according to the present invention has excellent workability at a low temperature, flexibility, and radiation resistance as well as a little deterioration of functions caused by water adsorption and has few dielectric loss and further excellent adhesion when the film is energized by coating the wire rod. More particularly, the thermoplastic polyimide used as a component of a bonded layer in the present invention has a specific glass transition temperature within the range of 100° C. to 250° C. depending on the structure, and melts by lamination at a temperature close to the glass transition temperature so that the curing of the thermosetting resin may be facilitated. Accordingly, after wrapping the laminate film of the present invention with its bonded layer inside around the wire rod, and the like, the adhesive laminate film for wire rod coating is bonded to the wire rod by heating at a glass transition temperature, that is, at the temperature from 100° C. to 250° C. The wire rod, therefore, does not suffer deterioration due to few effects caused by heating. Further, compared to the conventional polyimide, the thermoplastic polyimide used for the bonded layer indicates a much lower water adsorption, so that the polyimide suffers less deterioration in functions caused by water adsorption. Furthermore, when the wire rod is energized, due to a small dielectric constant less than 3.2, it has less dielectric loss, therefore, it can control heating the wire rod. Besides, the polyimide is confirmed to have superior characteristics in radiation resistance.

These characteristics are suitable for coating of superconductivity wire rods and the like and favorably applied for the particular use for superconductivity magnets of accelerators, but the other uses are not particularly limited. As described above, the embodiments of the polyimide resin, and the resin composition, the film-state joining component, and the adhesive laminate film for wire rod coating according to the present invention have variously been described so far, but the present invention is not limited to these embodiments. Also, any and all modifications, variations or equivalent arrangements which may occur to those skilled in the art should be considered to be within the scope of the invention.

EXAMPLES

An explanation will be given in detail to the present invention by examples mentioned below, but the present invention is not limited to these examples.

Water absorption is calculated by measurement based on ASTM (American Society for Testing and Materials) D570. A film-like composition; a composition sheet having a thickness of 25 μm, was heated at 150° C. for 3 hours to obtain a cured composition sheet. W1 was weight of the composition sheet after having been cured which was obtained by further drying at 150° C. for 30 minutes. W2 was weight obtained by wiping off the surface of the sheet after having immersed into distilled water (under an atmosphere of 20° C., 60% RH) for 24 hours, and then the water absorption was calculated by the following formula:

Water absorption coefficient $(\%) = (W2 - W1)/W1 \times 100$

Dielectric constant was calculated by making evaluations by the Q meter method (1 $kH_2$) in accordance with JISC (Japanese Industrial Standard Committee) 6481.

Peeling strength was measured in accordance with JISC 6481, described below the conditions when a sample was in an ordinary state; at 20° C., at a high temperature; at 150° C. The sample was cut in such a manner that the width of the obtained copper pattern of FCCL was 3 mm, and a tensile test under the condition of peeling at the angle of 90 degrees at the peeling test speed of 50 mm/min was conducted using a tensile tester ("S-100-C" manufactured by Shimadzu Corporation). The measured value is an average value of n=5.

The measuring method of materials in the examples 10 to 14 and the comparative examples 8 to 9 is as follows:

Intrinsic Viscosity

Intrinsic viscosity of polyamic acid was measured at 30±1° C. with an Oswald viscometer. The higher its intrinsic viscosity is, the higher its degree of polymerization is, which leads to superior mechanical properties as an end-product polyimide. Some concentrations of different solutions were determined to plot viscosity/concentration against concentration, and the line was extrapolated to zero concentration.

Glass Transition Temperature

The endothermic starting temperature was measured using a differential scanning calorimeter (DSC220 manufactured by Seiko Instruments) under the conditions of temperature rising velocity at 10° C./min. This endothermic starting temperature was regarded as a glass transition temperature. The lower the glass transition temperature is, the more superior the workability becomes.

Cross-cut Tape Test

A cross-cut tape test was carried out in accordance with JIS (Japanese Industrial Standards) K-5400. 10 points are the maximum and the higher the points are, the more the composition sheet has excellent adhesion.

(d) Tensile Strength

A tensile strength was measured in accordance with JIS K-7172. The higher the value is, the more superior the mechanical strength becomes.

PCT treatment physical property measurements of Examples 15 to 27 and Comparative Examples 10 to 19 were carried out as mentioned below.

The conditions of PCT (Pressure Cooker Test) treatment which was a reliability test of materials for electronics were temperature 121° C., humidity 100%, and 48 hours. The retention of peeling strength after PCT treatment was calculated by the following formula when the peeling strength before PCT treatment was represented as $F_1$, and the peeling strength after PCT treatment was represented as $F_2$:

Retention (%) of peeling strength after PCT treatment=$F_2/F_1 \times 100$

The residual volatile component in Examples 15 to 21 and Comparative Examples 10 to 15 was measured by a gas chromatography. Measuring conditions were as follows:

(Measuring Conditions)

Equipment: Chem Station manufactured Hewlett Packard Japan, Ltd (HP).

Carrier gas: Helium

Column: HP-Wax Bonded Polyethylene Glycol manufactured by HP

Carrier flow rate: 45 ml/min

Detector: FID

The residual volatile component was calculated by the following formula when the weight of resin compound was represented as $W_3$, and the equivalent weight of the residual volatile component measured by the gas chromatography was represented by $W_4$:

Residual volatile component (Weight %)=$W_4/W_3 \times 100$

Characteristic evaluation of a film-like laminated member in Examples 28 to 30 and Comparative Examples 20 to 22 was performed as follows:

Residual Solvent Content

The measurement was carried out by the following procedure:

Put a sample film in a thermal decomposition device to change into vaporization by decomposing it.

Feed gas generated by the decomposition into a GC-MS column and then start measuring.

Compare the obtained peak area to the peak area of the calibration curb to calculate the amount of solvent.

Calculate the residual solvent content from the ratio by weight of the film decomposed as a sample and the weight of the calculated solvent.

The calibration curve was drawn by the following method:

Determine the peak area by injecting a solvent to be detected into the GC-MS.

Determine the peak area by carrying out similar measurements each time the amount of the injected solvent was changed.

Plot the obtained result in a graph representing x-axis as the amount of the solvent and y-axis as the peak area.

Obtain a calibration curve based on the plot.

Assign the peak area obtained by measuring the GC-Ms after thermal decomposition of the film, so that it makes the amount of the solvent contained in the film clarified.

Its measuring equipment and conditions are as follows:

Thermal decomposition device: JP-3 manufactured by Japan Analytical Industry Co., Ltd.

GC: Hewlett Packard Hp5890-II

MS: Hewlett Packard Hp5871A

Decomposition conditions: 358° C.×5 sec

Column: DB-5 Capillary Column

Temperature profile: 35° C. (5 min)→temperature rise (10° C./min)

→150° C. (1.5 min)

Inlet/Detector: 250° C./280° C.

Oven/Needle temperature: 200° C./200° C.

Split ratio: 1/30

Sample amount: 0.5 mg

Peeling Strength

Peeling strength was measured by the following procedure at the time that a laminated member and a copper foil were bonded:

Superimpose a film-like laminated member on a 18 $\mu$m-electrolytic copper foil. Heat at 200° C. and apply a pressure of 3 MPa for 20 minutes to obtain a flexible copper clad laminate. The peeling strength of the obtained flexible copper clad laminate was measured in accordance with JIS C6481. Its conductor width was measured to be 3 mm.

The glass transition temperature measurements of Examples 35 to 42 and Comparative Examples 29 to 33 were carried out as follows:

The glass transition temperature was calculated from dynamic visco-elastic data using a DMS 200 (Japan Electronic Industry Development Association) in accordance with the DMA method.

Example 1

In a 500-ml glass flask, 0.1487 mole of 3,3'-bis(aminophenoxyphenyl)propane (meta-type, hereinafter referred to as BAPP-M) was added to 280 g of N,N-dimethylformamide (hereinafter referred to as DMF) to be stirred and dissolved under a nitrogen atmosphere. The solution in the flask was further stirred while cooling with iced water bath under a nitrogen substituted atmosphere. And then 0.1487 mole of 2,2-bis(4-hydroxyphenyl) propane-dibenzoate-3,3',4,4'-tetracarboxylic acid dianhydride (hereinafter referred to as ESDA) was gradually added with care to its viscosity. When the viscosity reached 1500 poise, the addition of ESDA was stopped and a polyamic acid polymer solution was obtained.

To this polyamic acid solution, 150 g of DMF, 35 g of β-picoline, and 60 g of acetic anhydride were added. After stirring for an hour, stirring was further continued below 100° C. for an hour to be imidized. Then, this solution was added dropwise to methanol with vigorous stirring. After drying filamentous polyimide precipitated out of the methanol at 100° C. for 30 minutes, the polyimide was pulverized by a mixer and then cleaning was performed with methanol After drying at 100° C. for 2 hours, a polyimide powder was obtained.

20 g of the obtained polyimide powder, 5 g of epoxy resin of Bisphenol A; Epikote 828 (manufactured by Shell International Chemicals Corporation), and 0.015 g of 2-ethyl-4-methylimidazole as an accelerator were dissolved in 83 g of DMF. The obtained varnish was cast onto a glass plate, dried at 100° C. for 10 minutes, peeled off from the glass plate and set on a steel frame. A sheet having a thickness of 25 $\mu$m was obtained by further drying at 150° C. for 20 minutes. The obtained sheet was sandwiched between a polyimide film (Apical 50AH, manufactured by Kaneka Corporation) and a copper foil of 25 $\mu$m thickness, and then was heated at 200° C. and pressurized at pressure 3 MPa for 20 minutes to obtain a flexible copper clad laminate.

Example 2

The varnish obtained in Example 1 was applied onto a polyimide film (Apical 50AH manufactured by Kaneka Corporation) and then dried by heating at 100° C. for 10 minutes and further dried by heating at 150° C. for 20 minutes to form an adhesive layer having a thickness of 25 $\mu$m. The obtained one-sided polyimide film and a copper foil having a thickness of 25 $\mu$m were heated at 200° C. and pressurized at pressure 3 MPa for 20 minutes to obtain a flexible copper clad laminate.

Example 3

20 g of the polyimide powder obtained in Example 1 and 5 g of glycidyl amine-type epoxy resin; TETRAD-C (manufactured by Mitsubishi Gas Chemical Co., Inc.) were dissolved in 83 g of DMF to prepare a varnish. The obtained varnish was cast onto a glass plate, dried at 100° C. for 10 minutes, peeled off from the glass plate, set on a steel frame and further dried at 150° C. for 20 minutes. Then a sheet having a thickness of 25 $\mu$m was obtained. The obtained sheet was sandwiched between a polyimide film (Apical 50AH, Kaneka Corporation) and a copper foil of 25 $\mu$m thickness. After heating at 200° C. and applying a pressure of 3 MPa for 20 minutes, a flexible copper clad laminate was obtained.

Example 4

A polyamic acid polymer solution and a polyimide powder were obtained in the same manner as in Example 1 except that a diamine component was 4,4'-(1,3-phenylenebis (1-methyl ethylidene)) bisaniline (para-type).

The obtained polyimide powder was treated in the same manner as in Example 1 to obtain a flexible copper clad laminate.

Example 5

A polyamic acid polymer solution and a polyimide powder were obtained in the same manner as in Example 1 except that a diamine component was 4,4'-bis(aminophenoxyphenyl)propane (para-type).

The obtained polylmide powder was treated in the same manner as in Example 1 to obtain a flexible copper clad laminate.

Example 6

A polyamic acid polymer solution; and a polyimide powder were obtained in the same manner as in Example 1 except that a diamine component was 3,3'-bis(aminophenoxyphenyl)sulfone (BAPS-M).

The obtained polyimide powder was treated in the same manner as in Example 1 to obtain a flexible copper clad laminate.

Comparative Example 1

In a 500-ml glass flask, 0.1487 mole of 3,3'-bis(aminophenoxyphenyl)propane (hereinafter referred to as BAPP-M) was added to 280 g of dimethylformamide (DMF) to be stirred and dissolved under a nitrogen atmosphere. The solution in the flask was further stirred while cooled with an ice-water bath under a nitrogen substituted atmosphere. And then 0.1487 mole of benzophenonetetracarboxylic acid dianhydride (hereinafter referred to as BTDA) was gradually added with care to its viscosity. When the viscosity reached 1500 poise, the addition of BTDA was stopped and a polyamic acid polymer solution was obtained.

To this polyamic acid solution, 150 g of DMF, 35 g of β-picoline, and 60 g of acetic anhydride were added. After stirring for an hour, stirring was further continued below 100° C. for an hour for imidization. Then, this solution was added dropwise into methanol with vigorous stirring. After drying filamentous polyimide precipitated out of the methanol at 100° C. for 30 minutes, the polyimide was pulverized by a mixer and then Soxhlet cleaning was performed with methanol. After drying at 100° C. for 2 hours, a polyimide powder was obtained. 20 g of the obtained polyimide powder, 5 g of Epikote 828 (manufactured by Shell International Chemicals Corporation), and 0.015 g of 2-ethyl-4-methylimidazole were dissolved in 83 g of DMF to prepare a varnish. The obtained varnish was cast onto a glass plate, and peeled off from the glass plate, after dried at 100° C. for 10 minutes and set on a steel frame. A sheet having a thickness of 25 μm was obtained by further drying at 150° C. for 20 minutes. The obtained sheet was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Comparative Example 2

20 g of the polyimide powder obtained in Example 1 was dissolved in 83 g of DMF to prepare a varnish. The obtained varnish was cast onto a glass plate, dried at 100° C. for 10 minutes, peeled off from the glass plate, and set on a steel frame. A sheet having a thickness of 25 μm was obtained by further drying at 150° C. for 20 minutes. The obtained sheet was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Comparative Example 3

10 g of Pratabond (Co-polymerized nylon, manufactured by Nihon Rilsan Co., Ltd.), 20 g of Epikote 828 (manufactured by shell International Chemicals Corporation), and 1 g of diaminodiphenyl sulfone were dissolved in 83 g of DMF to prepare a varnish. The obtained varnish was cast onto a glass plate, dried at 100° C. for 10 minutes, peeled off from the glass plate and set on a steel frame. A sheet having a thickness of 25 μm was obtained by further drying at 150° C. for 20 minutes. The obtained sheet was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Peeling strength and solder heat resistance were evaluated on the coppered flexible laminated plate obtained in each of Examples 1 to 6 and Comparative Examples 1 to 3 as described above. Water absorption of each adhesive sheet was evaluated as well. The results obtained are shown in Table 1.

TABLE 1

|  | Peeling strength (kgf/cm) | | Solder heat resistance | Water absorption (%) |
| --- | --- | --- | --- | --- |
|  | 20° C. | 150° C. |  |  |
| Example 1 | 1.0 | 0.8 | ○ | 0.5 |
| Example 2 | 1.0 | 0.8 | ○ | 0.5 |
| Example 3 | 1.2 | 0.9 | ○ | 0.6 |
| Example 4 | 1.1 | 0.9 | ○ | 0.6 |
| Example 5 | 1.0 | 0.8 | ○ | 0.6 |
| Example 6 | 1.0 | 0.8 | ○ | 1.0 |
| Comparative Example 1 | 1.0 | 0.8 | X | 1.8 |
| Comparative Example 2 | 0.2 | 0.1 | ○ | 0.4 |
| Comparative Example 3 | 1.2 | 0.1 | X | 2.0 |

Example 7

In a 500 ml glass flask, 0.1338 mole of 3,3'-bis(aminophenoxyphenyl)propane (meta-type, hereinafter referred to as BAPP-M) and 0.01487 mole of α,ω-bis (3-aminopropyl) polydimethylsiloxane (APPS) were added to 280 g of dimethyl-formamide (hereinafter referred to as DMF) to be stirred and dissolved under a nitrogen atmosphere. The solution in the flask was further stirred while cooled with an ice-water bath under a nitrogen substituted atmosphere. And then 0.1487 mole of 2,2-bis(4-hydroxyphenyl) propanedibenzoate -3,3',4,4'-tetracarboxylic acid dianhydride (hereinafter referred to as ESDA) was gradually added with care to its viscosity. When the viscosity reached 1000 poise, the addition of ESDA was stopped and then a polyamic acid polymer solution was obtained.

To this polyamic acid solution, 150 g of DMF, 35 g of β-picoline, and 60 g of acetic anhydride were added. After stirring for an hour, stirring was further continued below 100° C. for an hour for imidization. Then, this solution was added dropwise into methanol with vigorous stirring. After drying filamentous polyimide precipitated out of the methanol at 100° C. for 30 minutes, the polyimide was pulverized by a mixer and then Soxhlet cleaning was performed with methanol. After drying at 100° C. for 2 hours, a polyimide powder was obtained. 20 g of the obtained polyimide powder, 5 g of epoxy resin of Bisphenol A; Epikote 828 (manufactured by Shell International Chemicals Corporation), and 0.015 g of 2-ethyl-4-methylimidazole were dissolved in 83 g of DMF and mixed to obtain a varnish. The obtained varnish was cast onto a glass plate, dried at 100° C. for 10 minutes, peeled off from the glass plate and set on a steel frame. A sheet having a thickness of 25 μm was obtained by further drying at 150° C. for 20 minutes. The obtained sheet was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Example 8

The varnish obtained in Example 7 was applied onto a polyimide film (Apical 50AH manufacture by Kaneka Corporation) and then dried by heating at 100° C. for 10 minutes and further dried by heating at 150° C. for 20 minutes to form an adhesive layer having a thickness of 25 μm. The obtained one-sided polyimide film and a copper foil of 25 μm thickness were heated at 200° C. and pressurized at pressure 3 MPa for 20 minutes to obtain a flexible copper clad laminate.

Example 9

20 g of the polyimide powder obtained in Example 7 and 5 g of glycidyl amine-type epoxy resin; TETRAD-C (manufactured by Mitsubishi Gas Chemical Co., Inc.) were dissolved in 83 g tetrahydrofuran (hereinafter referred to as THF) to prepare a varnish. The obtained varnish was cast onto a glass plate. After drying at 100° C. for 10 minutes, the varnish was peeled off from the glass plate, set on a steel frame, and further dried at 150° C. for 20 minutes to obtain a sheet having a thickness of 25 μm. The obtained sheet was sandwiched between a polyimide film (Apical 50AH, manufactured by Kaneka Corporation) and a copper foil of 25 μm thickness. After heating at 200° C. and applying a pressure of 3 MPa for 20 minutes, a flexible copper clad laminate was obtained.

Comparative Example 4

In a 500 ml glass flask, 0.1487 mole of BAPP-M was added to 280 g of dimethylformamide (DMF) to be stirred and dissolved under a nitrogen atmosphere. The solution in the flask was further stirred while cooled with an ice-water bath under a nitrogen substituted atmosphere. And then 0.1487 mole of benzophenonetetracarboxylic acid dianhydride (hereinafter referred to as BTDA) was gradually added with care to its viscosity. When the viscosity reached 1000 poise, the addition of BTDA was stopped and then a polyamic acid polymer solution was obtained.

To this polyamic acid solution, 150 g of DMF, 35 g of β-picoline, and 60 g of acetic anhydride ,ere added. After stirring for an hour, stirring was further continued below 100° C. for an hour for imidization. Then, this solution was added dropwise into methanol with vigorous stirring. After drying filamentous polyimide precipitated out of the methanol at 100° C. for 30 minutes, the polyimide was pulverized by a mixer and then Soxhlet cleaning was performed with methanol. After drying at 100° C. for 2 hours, a polyimide powder was obtained.

20 g of the obtained polyimide powder, 5 g of Epikote 828 (manufactured by Shell International Chemicals Corporation), and 0.015 g of 2-ethyl-4-methylimidazole were dissolved in 83 g of THF and mixed to obtain a varnish. The vanished was cast onto a glass plate, dried at 100° C. for 10 minutes, peeled off from the glass plate and set on a steel frame. A sheet having a thickness of 25 μm was obtained by further drying at 150° C. for 20 minutes. The obtained sheet was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Comparative Example 5

In a 500 ml glass flask, 0.1487 mole of 3,3'-bis(aminophenoxyphenyl)propane (hereinafter referred to as BAPP-M) was charged into 280 g of dimethylformamide (DMF) to be stirred and dissolved under a nitrogen atmosphere. The solution in the flask was further stirred while cooled with an ice-water bath under a nitrogen substituted atmosphere. And then 0.1487 mole of pyromellitic acid dianhydride was gradually added with care to its viscosity. When the viscosity reached 1000 poise, the addition of pyromellitic acid dianhydride was stopped and then a polyamic acid polymer solution was obtained.

To this polyamic acid solution, 150 g of DMF, 35 g of β-picoline, and 60 g of acetic anhydride were added. After stirring for an hour, stirring was further continued below 100° C. for an hour for imidization. Then, this solution was added dropwise into methanol with vigorous stirring. After drying filamentous polyimide precipitated out of the methanol at 100° C. for 30 minutes, the polyimide was pulverized by a mixer and then Soxhlet cleaning was performed with methanol. After drying at 100° C. for 2 hours, a polyimide powder was obtained.

The trial of dissolving 20 g of obtained polyimide powder in 83 g of THF was failed because of precipitation of the polyimide powder.

Comparative Example 6

20 g of the polyimide powder obtained in Example 7 was dissolved in 83 g of THF to prepare a varnish. The obtained varnish was cast onto a glass plate, dried at 100° C. for 10 minutes, peeled off from the glass plate and set on a steel frame, and further dried at 150° C. for 20 minutes. A sheet having a thickness of 25 μm was obtained. The obtained sheet was sandwiched between a polyimide film (Apical 50AH, manufactured by Kaneka Corporation) and a copper foil of 25 μm thickness. After heating at 200° C. and applying a pressure of 3 MPa for 20 minutes, a flexible copper clad laminate was obtained.

Comparative Example 7

10 g of Pratabond M1276 (Co-polymerized nylon, manufactured by Nihon Rilsan Co., Ltd.), 20 g of Epikote 828 (manufactured by Shell International Chemicals Corporation), and 1 g of diaminodiphenyl sulfone were dissolved in 83 g of DMF to obtain a varnish. The obtained varnish was cast onto a glass plate, dried at 100° C. for 10 minutes peeled off from the glass plate and set on a steel frame. A sheet having a thickness of 25 μm was obtained by further drying at 150° C. for 20 minutes. The obtained sheet was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Peeling strength and solder heat resistance were evaluated on the flexible laminated plate obtained in each of Examples 7 to 9 and Comparative Examples 4 to 7. Water absorption of each adhesive sheet was evaluated as well. The results obtained are shown in Table 2.

TABLE 2

| | Peeling strength (kgf/cm) | | Solder heat | Water Absorption | THF |
|---|---|---|---|---|---|
| | 20° C. | 150° C. | resistance | (%) | solubility |
| Example 7 | 1.0 | 0.7 | ○ | 0.5 | ○ |
| Example 8 | 1.0 | 0.7 | ○ | 0.5 | ○ |
| Example 9 | 1.2 | 0.8 | ○ | 0.6 | ○ |
| Comparative Example 4 | 1.0 | 0.7 | X | 1.8 | ○ |
| Comparative Example 5 | — | — | — | — | X |
| Comparative Example 6 | 0.2 | 0.1 | ○ | 0.4 | ○ |
| Comparative Example 7 | 1.2 | 0.1 | X | 2.0 | ○ |

Example 10

In a 500 ml glass flask with a reflux condenser, 300 g of acetic anhydride and 50 g of crude material of tetracarboxylic acid dianhydride (ESDA) were added. After stirring was conducted by heating at 120° C. for an hour, the temperature was lowered to separate the recrystallized ESDA by filtration. ESDA having 1% of lower impurities was obtained after drying in a vacuum at 120° C. for 24 hours.

20.0 g (100 mmole) of 4,4'-diaminodiphenyl ether (DDE) and 244 g of dimethylformamide (DMF) were added to a 500 ml four-necked flask equipped with a thermometer, a stirrer, and a calcium chloride tube. After dissolving diamine, 2,2-bis 4-hydroxyphenyl)propanedibenzoate-3,3', 4,4-tetracarboxylic acid dianhydride (ESDA) having 0.3% by weight of residual impurities content, 57.7 g (100 mole of pure ESDA were added to the flask at 25° C. After stirring for 3 hours, the solution was reacted to obtain a polyamic acid solution. The intrinsic viscosity of this polyamic acid solution was 1.1.

The polyamic acid solution was applied by flow casting onto a PET film and heated at 80° C. for 30 minutes. After peeling off the PET film, heating was conducted at 150° C. 200° C., and 250 ° C. for 30 minutes respectively. After f heating at 300° C. for 10 minutes, a polyimide film of high strength having a thickness of 25 μm was obtained. It was confirmed that there was absorption by an imide group at 1780 cm$^{-1}$ in an infrared radiation measurement. The polyimide film had a glass transition temperature of 225° C. and a tensile strength of 15.3

Further, the polyamic acid solution was cast onto an aluminum plate (JIS H4000 A1050P) and al soft soda glass plate with a doctor knife. After heating at 80° C., 150° C., 200° C., and 250° C. respectively for 30 minutes, heating was finally conducted at 300° C. for 10 minutes to obtain a polyimide coating having a thickness of 20 to 25 μm. In a crosscut tape test, both of the polyimide coatings on the aluminum and glass plates got 10 points.

Example 11

A polyamic acid with an intrinsic viscosity of 1.1 was obtained in the similar manner as in Example 10 except that the adding order of ESDA having a residual impurities content of 0.3 weight % and DDE was reversed. This polyimide resin was confirmed to have absorption caused by an imide group at 1780 cm$^{-1}$ in an infrared radiation measurement. The polyimide film had a glass transition temperature of 225° C. and a tensile strength of 15.2 kg/cm$^2$. On the other hand, in a crosscut tape test, both of the polyimide coating on the aluminum and glass plates got 10 points.

Example 12

A polyamic acid solution with an intrinsic viscosity of 1.0 was obtained in the similar manner as in Example 10 except that diamine was used as 19.8 g of 4,4'-diaminodiphenylmethane (DAM) instead of DDE. In addition, a polyimide film and a polyimide coating with high strength were obtained in the same manner as in Example 10. This polyimide resin was confirmed to have absorption caused by an imide group at 1780 cm$^{-1}$ in an infrared radiation measurement. The polyimide film had a glass transition temperature of 220° C. and a tensile strength of 15.2 kg/cm$^2$. On the other hand, in a crosscut tape test, both of the polyimide coating on the aluminum and glass plates got 10 points.

Example 13

A polyamic acid solution with an intrinsic viscosity of 1.0 was obtained in the similar manner as in Example 10 except that diamine was used as 2,2-bis [4-(4-aminophenoxy) phenyl] propane (BAPP) instead of DDE. In addition, a polyimide film and a polyimide coating with high strength were obtained in the same manner as in Example 10. This polyimide was confirmed to have absorption caused by an imide group at 1780 cm$^{-1}$ in an infrared radiation measurement. The polyimide film had a glass transition temperature of 205° C. and a tensile strength of 14.5 kg/cm$^2$. On the other hand, in a crosscut tape test, both of the polyimide coating on the aluminum and glass plates got 10 points.

Example 14

A polyamic acid with an intrinsic viscosity of 0.8 was obtained in the similar manner as in Example 10 except that 57.7 g (100 mmole in ESDA pure content) of ESDA wit residual impurities content of 1.0 wt % as an acid dianhydride component. In addition, a polyimide film and a polyimide coating with high strength were obtained in the same manner as in Example 10. This polyimide resin was confirmed to lave absorption caused by an imide group at 1780 cm$^{-1}$ in an infrared radiation measurement. The polyimide film had a glass transition temperature of 215° C. and a tensile strength of 12.5 kg/cm$^2$. On the other hand, in a crosscut tape test, both of the polyimide coating on the aluminum and glass plates got 10 points.

Comparative Example 8

A polyamic acid with an intrinsic viscosity of 0.24 was obtained in the similar manner as in Example 10 except that 57.7 g (100 mmole in ESDA pure content) of ESDA with compound (1) of 1.5 wt % as an acid dianhydride component. In addition, a polyimide film and a polyimide coating with high strength were obtained in the same manner as in Example 10. This polyimide resin was confirmed to have absorption caused by an imide group at 1780 cm$^{-1}$ in an infrared radiation measurement. The polyimide film was very fragile and not self-support. Accordingly, it was impossible to measure its tensile strength. In a crosscut tape test, both of the polyimide coating on the aluminum and glass plates got 2 points.

Comparative Example 9

A polyamic acid with an intrinsic viscosity of 0.28 was obtained in the similar manner as in Example 10 except that 57.7 g (100 mmole in ESDA pure content) of ESDA with compound (2) of 1.5 wt % as an acid dianhydride component. In addition, a polyimide film and a polyimide coating with high strength were obtained in the same manner as in Example 10. This polyimide resin was confirmed to have absorption caused by an imide group at 1780 cm$^{-1}$ in an infrared radiation measurement. The polyimide film was very fragile and not self-support. Accordingly, it was impossible to measure its tensile strength. In a crosscut tape test, both of the polyimide coating on the aluminum and glass plates got 3 points.

Example 15

In a 500 ml glass flask, 0.1487 mole of 3,3'-bis(aminophenoxyphenyl)propane (meta-type: hereinafter referred to as BAPP-M) was added to 280 g of dimethylformamide (hereinafter referred to as DMF) to be stirred and dissolved under a nitrogen atmosphere. The solution in the flask was further stirred while cooled with an ice-water bath under a nitrogen substituted atmosphere. And then 0.1487 mole of 2,2-bis(4-hydroxyphenyl) propanedibenzoate-3,3',4,4'-tetracarboxylic acid dianhydride (hereinafter referred to as ESDA) was gradually with care to its viscosity. When the viscosity reached 1500 poise, the addition of ESDA was stopped and then a polyamic acid polymer solution was obtained.

To this polyamic acid solution, 150 g of DMF, 35 g of β-picoline, and 60 g of acetic anhydride were added. After stirring for an hour, stirring was further continued below 100° C. for an hour for imidization. Then, this solution was added dropwise into methanol with vigorous stirring. After drying filamentous polyimide precipitated out of the methanol at 100° C. for 30 minutes, the polyimide was pulverized by a mixer and then Soxhlet cleaning was performed with methanol. After drying at 100° C. for 2 hours, a polyimide powder was obtained.

20 g of the obtained polyimide powder, 5 g of epoxy resin of Bisphenol A; Epikote 828 (manufactured by Shell International Chemicals Corporation), and 0.015 g of 2-ethyl-4-methylimidazole were dissolved in 83 g of mixed solution of dioxane and THF at a 1:1 weight ratio to prepare a varnish. The obtained varnish was cast onto a glass plate, dried at 100° C. for 10 minutes, peeled off from the glass plate and set on a steel frame. A sheet having a thickness of 25 μm was obtained by further drying at 150° C. for 20 minutes. The obtained sheet was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Example 16

The varnish obtained in Example 15 was applied onto a polyimide film (Apical 50AH manufactured by Kaneka Corporation) and then dried by heating at 100° C. for 10 minutes and further dried by heating at 150° C. for 20 minutes to form an adhesive layer having a thickness of 25 μm. The obtained one-sided polyimide film and a copper foil of 25 μm thickness were heated at 200° C. and pressurized at pressure 3 MPa for 20 minutes to obtain a flexible copper clad laminate.

Example 17

20 g of the polyimide powder obtained in Example 15 and g of glycidylamine-type epoxy resin; TETRAD-C (manufactured by Mitsubishi Chemical Co., Inc.) were dissolved in 83 g of mixed solution of dioxane and THF at a 1:1 weight ratio to obtain a varnish. The obtained varnish was cast onto a glass plate, dried at 100° C. for 10 minutes, peeled off from the glass plate and set on a steel frame. A sheet having a thickness of 25 μm was obtained by further drying at 150° C. for 20 minutes. The obtained sheet was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Example 18

A polyamic acid polymer solution and a polyimide powder were obtained in the same manner as in Example 15 except that diamine component was 4,4'-[1,3-phenylenebis (1-methyl ethylidene)] bisaniline (para-type). The obtained polyimide powder was treated in the same manner as in Example 15 to obtain a flexible copper clad laminate.

Example 19

A polyamic acid polymer solution land a polyimide powder were obtained in the same manner as in Example 15 except that a diamine component was 4,4'-bis (aminophenoxyphenyl) propane (para-type). The obtained polyimide powder was treated in the same manner as in Example 15 to obtain a flexible copper clad laminate.

Example 20

A polyamic acid polymer solution and a polyimide powder were obtained in the same manner as in Example 15 except that a diamine component was 3,3'-bis (aminophenoxyphenyl) sulfone (BAPS-M). The obtained polyimide powder was treated in the same manner as in Example 15 to obtain a flexible copper clad laminate.

Example 21

A flexible copper clad laminate was obtained in the same manner as in Example 15 except that the polyimide powder obtained in Example 15, Bisphenol A-type epoxy resin (Epikote 828), and 2-ethyl-4-methylimidazole used as a curing accelerator were dissolved in DMF.

Comparative Example 10

In a 500 ml glass flask, 0.1487 mole of 3,3'-bis(aminophenoxyphenyl)propane (hereinafter referred to as BAPP- M) was added to 280 g of dimethylformamide (DMF) to be stirred and dissolved under a nitrogen atmosphere. The solution in the flask was further stirred while cooled with an ice-water bath under a nitrogen substituted atmosphere. And then 0.1487 mole of benzophenonetetracarboxylic acid dianhydride (hereinafter referred to as BTDA) was gradually addled while with care to its viscosity. When the viscosity reached 1500 poise, the addition of BTDA was stopped and then a polyamic acid polymer solution was obtained.

To this polyamic acid solution, 150 g of DMF, 35 g of β-picoline, and 60 g of acetic anhydride were added. After stirring for an hour, stirring was further continued below 100° C. for an hour for imidization. Then, this solution was added dropwise into methanol with vigorous stirring. After drying filamentous polyimide precipitated out of the methanol at 100° C. for 30 minutes, the polyimide was pulverized by a mixer and then Soxhlet cleaning was performed with methanol. After drying at 100° C. for 2 hours, a polyimide powder was obtained.

20 g of the obtained polyimide power, 5 g of Epikote 828 (manufactured by Shell International chemicals Corporation), and 0.015 g of 2-ethyl-4-methylimidazole were dissolved in 83 g of DMF to obtain a varnish. The obtained varnish was cast onto a glass plate, dried at 100° C. for 10 minutes, peeled off from the glass plate and set on a steel frame. A sheet having a thickness of 25 μm was obtained by further drying at 150° C. for 20 minutes. The obtained sheet was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Comparative Example 11

A flexible copper clad laminate was obtained in the same manner as in Comparative Example 10 except that the polyimide powder obtained in Comparative Example 10 was dissolved in a mixed solution of dioxane and TBF at a 1:1 weight ratio.

Comparative Example 12

20 g of the polyimide powder obtained in Example 15 was dissolved in 83 g of DMF to prepare a varnish. The obtained varnish was cast onto a glass plate, dried at 100° C. for 10 minutes, peeled off from the glass plate and set on a steel frame. A sheet having a thickness of 25 μm was obtained by further drying at 150° C. for 20 minutes. The obtained sheet was sandwiched between a polyimide film (Apical 50AH, manufactured by Kaneka Corporation) and a copper foil of 25 μm thickness. After heating at 200° C. and applying a pressure of 3 MPa for 20 minutes, a flexible copper clad laminate was obtained.

Comparative Example 13

A flexible copper clad laminate was obtained in the same manner as in Comparative Example 12 except that the polyimide powder obtained in Example 15 was dissolved in a mixed solution of dioxane and THF at a 1:1 weight ratio.

Comparative Example 14

10 g of Pratabond M1276 (Co-polymerized nylon, manufactured by Nihon Rilsan Co., Ltd.), 20 g of Epikote 828 (manufactured by Shell International Chemicals Corporation), and 1 g of diaminodiphenyl sulfone were dissolved in 83 g of DMF to obtain a varnish. The obtained varnish was cast onto a glass plate, dried at 100° C. for 10 minutes, peeled off from the glass plate and set on a steel frame. A sheet having a thickness of 25 μm was obtained by further drying at 150° C. for 20 minutes. The obtained sheet was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Comparative Example 15

A flexible copper clad laminate was obtained in the same manner as in Comparative Example 5 except that Pratabond M1276, Epikote 828, and diaminodiphenyl sulfone in Comparative Example 15 were dissolved in a mixed solution of dioxane and THF at a 1:1 weight ratio.

Water absorption and residual volatile component were evaluated on the resin composition, and peeling strength and solder heat resistance were evaluated on the flexible copper clad laminate obtained in each of Examples 15 to 21 and Comparative Examples 10 to 15. The water absorption for each adhesive sheet was evaluated as well. The results obtained are shown in Table 3.

TABLE 3

| | Peeling strength (kgf/cm) (Before PCT treatment) | | Peeling strength (kgf/cm) (After PCT treatment) | | Peeling strength retention (%) after PCT treatment | | Solder heat resistance | Water absorption (%) | Residual volatile content (% by weight) |
|---|---|---|---|---|---|---|---|---|---|
| | 20° C. | 150° C. | 20° C. | 150° C. | 20° C. | 150° C. | | | |
| Example 15 | 1.0 | 0.8 | 0.9 | 0.7 | 90 | 88 | ○ | 0.5 | 0.3 |
| Example 16 | 1.0 | 0.8 | 0.9 | 0.7 | 90 | 88 | ○ | 0.5 | 0.2 |
| Example 17 | 1.2 | 0.9 | 1.1 | 0.8 | 92 | 89 | ○ | 0.6 | 0.5 |
| Example 18 | 1.1 | 0.9 | 1.0 | 0.8 | 91 | 89 | ○ | 0.6 | 0.5 |
| Example 19 | 1.0 | 0.8 | 0.9 | 0.7 | 90 | 88 | ○ | 0.6 | 0.5 |
| Example 20 | 1.0 | 0.8 | 0.9 | 0.7 | 90 | 88 | ○ | 1.0 | 0.7 |
| Example 21 | 1.0 | 0.8 | 0.5 | 0.4 | 50 | 50 | ○ | 0.5 | 1.5 |
| Comparative Example 10 | 1.0 | 0.8 | 0.2 | 0.1 | 20 | 13 | X | 1.8 | 5.0 |
| Comparative Example 11 | 1.0 | 0.8 | 0.3 | 0.2 | 30 | 25 | X | 1.8 | 3.5 |
| Comparative Example 12 | 0.2 | 0.1 | 0.0 | 0.0 | 0 | 0 | ○ | 0.4 | 0.5 |
| Comparative Example 13 | 0.2 | 0.1 | 0.0 | 0.0 | 0 | 0 | ○ | 0.4 | 0.3 |
| Comparative Example 14 | 1.2 | 0.1 | 0.2 | 0.0 | 17 | 0 | X | 2.0 | 4.8 |
| Comparative Example 15 | 1.2 | 0.1 | 0.3 | 0.0 | 25 | 0 | X | 2.0 | 3.7 |

Example 22

In a 500 ml glass flask, 0.1487 mole of 3,3'-bis (aminophenoxyphenyl) propane (meta-type: hereinafter referred to as BAPP-M) was added to 280 g of dimethylformamide (hereinafter referred to as DMF) to be stirred and dissolved under a nitrogen atmosphere. The solution in the flask was further stirred while cooled with an ice-water bath under a nitrogen substituted atmosphere. And then 0.1416 mole of 2,2-bis(4-hydroxyphenyl) propanedibenzoate-3,3',4,4'-tetracarboxylic acid dianhydride (hereinafter referred to as ESDA) was gradually added with care to its viscosity. When the viscosity reached 1500 poise, the addition of ESDA was stopped and then a polyamic acid oligomer solution was obtained.

To this polyamic acid oligomer solution, 150 g of DMF, 35 g of β-picoline, and 60 g of acetic anhydride were added. After stirring for an hour, stirring was further continued below 100° C. for an hour for imidization. Then, this solution was added dropwise into methanol with vigorous stirring. After drying filamentous polyimide precipitated out of the methanol at 100° C. for 30 minutes, the polyimide was pulverized by a mixer and then Soxhlet cleaning was performed with methanol. After drying at 100° C. for 2 hours, a polyimide oligomer powder was obtained (molecular weight 30000).

20 g of the obtained polyimide oligomer powder, 5 g of epoxy resin of Bisphenol A; Epikote 828 (manufactured by Shell International Chemicals Corporation), and 0.015 g of 2-ethyl-4-methylimidazole as a curing accelerator were dissolved in 83 g of DMF to obtain a varnish. The obtained varnish was cast onto a glass plate, dried at 100° C. for 10 minutes, peeled off from the glass plate and set on a steel fame. A sheet having a thickness of 25 μm was obtained by further drying at 150° C. for 20 minutes. The obtained sheet was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Example 23

The varnish obtained in Example 22 was applied onto a polyimide film (Apical 50AH, manufactured by Kaneka Corporation). After drying by heating at 100° C. for 10 minutes, the varnish was further dried by heating at 150° C. for 20 minutes to form an adhesive layer having a thickness of 25 μm. A single-sided polyimide film with the obtained adhesive layer and a copper foil of 25 μm thickness were heated at 200° C. under the pressure of 3 MPa for 20 minutes to obtain a flexible copper clad laminate.

Example 24

20 g of the polyimide powder obtained in Example 22 and 5 g of glycidylamine-type epoxy resin; TETRAD-C (manufactured by Mitsubishi Gas Chemical Co., Inc.) were dissolved in 83 g of DMF to obtain a varnish. The obtained varnish was cast onto a glass plate, dried at 100° C. for 10 minutes, peeled off from the glass plate and set on a steel frame. A sheet having a thickness of 25 μm was obtained by further drying at 150° C. for 20 minutes. The obtained sheet was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Example 25

A polyamic acid oligomer solution and a polyimide oligomer powder (molecular weight: 40000) were obtained in the same manner as in Example 22 except that a diamine component was 4,4'-[1,3-phenylenebis(1-methylethylidene)] bisaniline (para-type).

The obtained polyimide oligomer powder was treated in the same manner as in Example 22 to obtain a flexible copper clad laminate.

Example 26

A polyamic acid oligomer solution and a polyimide oligomer powder (molecular weight: 20000) were obtained in the same manner as in Example 22 except that a diamine component was 4,4'-bis(aminophenoxyphenyl)propane (para-type).

The obtained polyimide oligomer powder was treated in the same manner as in Example 22 to obtain a flexible copper clad laminate.

Example 27

A polyamic acid oligomer solution and a polyimide oligomer powder (molecular weight: 10000) were obtained in the same manner as in Example 22 except that a diamine component was 3,3'-bis(aminophenoxyphenyl)sulfone (BAPS-M). The thus-obtained polyimide oligomer powder was treated in the same manner as in Example 22 to obtain a flexible copper clad laminate.

Comparative Example 16

In a 500 ml glass flask, 0.1487 mole of 3,3'-bis(aminophenoxyphenyl) propane (hereinafter referred to as BAPP-M) was added to 280 g of dimethylformamide (DMF) to be stirred and dissolved under a nitrogen atmosphere. The solution in the flask was further stirred while cooled with an ice-water bath under a nitrogen substituted atmosphere. And then 0.1416 mole of benzophenonetetracarboxylic acid dianhydride (hereinafter referred to as BTDA) was gradually added with care to its viscosity. When the viscosity reached 1500 poise, the addition of BTDA was stopped and then a polyamic acid oligomer solution was obtained.

To this polyamic acid oligomer solution, 150 g of DMF, 35 g of β-picoline, and 60 g of acetic anhydride were added. After stirring for an hour, stirring was further continued below 100° C. for an hour for imidization. Then, this solution was added dropwise into methanol with vigorous stirring. After drying filamentous polyimide oligomer precipitated out of the methanol at 100° C. for 30 minutes, the polyimide oligomer was pulverized by a mixer and then Soxhlet cleaning was performed with methanol. After drying at 100° C. for 2 hours, a polyimide powder was obtained (molecular weight: 30000).

20 g of the obtained polyimide oligomer powder, 5 g of Epikote 828 (manufactured by Shell International Chemicals Corporation), and 0.015 g of 2-ethyl-4-methylimidazole were dissolved in 83 g of DMF to obtain a varnish. The obtained varnish was cast onto a glass plate. After drying at 100° C. for 10 minutes, the varnish was peeled off from the glass plate and was set on an iron frame. A sheet having a thickness of 25 μm was obtained by further drying at 150° C. for 20 minutes. The obtained sheet was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Comparative Example 17

20 g of the polyimide oligomer powder obtained in Example 22 was dissolved in 83 g of DMF to obtain a varnish. The obtained varnish was cast onto a glass plate. After drying at 100° C. for 10 minutes, the varnish was peeled off from the glass plate and was set on a steel frame. A sheet having a thickness of 25 μm in was obtained by further drying at 150° C. for 20 minutes. The obtained sheet was sandwiched between a polyimide film (Apical 50AH, manufactured by Kaneka Corporation) and a copper foil of 25 μm thickness. After heating at 200° C. and applying a pressure of 3 MPa for 20 minutes, a flexible copper clad laminate was obtained.

Comparative Example 18

10 g of Pratabond M1276 (Co-polymerized nylon, manufactured by Nihon Rilsan Co., Ltd.), 20 g of Epikote 828 (manufactured by Shell International Chemicals Corporation), and 1 g of diaminodiphenyl sulfone were dissolved in 83 g of DMF to obtain a varnish. The obtained varnish was cast onto a glass plate. After drying at 100° C. for 10 minutes, the varnish was peeled off from the glass plate and was set on a steel frame. A sheet having a thickness of 25 μm was obtained by further drying at 150° C. for 20 minutes. The obtained sheet was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Comparative Example 19

A flexible copper clad laminate was obtained in the same manner as in Example 22 except that a polyimide polymer powder (molecular weight: 100000) was obtained by gradually adding 0.1487 mole of ESDA which is equivalent mole to 0.1487 mole of BAPP-M in Example 22.

Peeling strength and solder heat resistance were evaluated on the flexible copper clad laminate obtained in each of Examples 22 to 27 and Comparative Examples 16 to 19 as described above. Water absorption of each adhesive sheet was evaluated as well. The results obtained are shown in Table 4.

and 0.112 mole of 2,2-bis(4-hydroxyphenyl)propanebenzoate-3,3',4,4'-tetracarboxylic acid dianhydride (hereinafter referred to as ESDA) was gradually added to the solution to be stirred under a nitrogen atmosphere. The solution in the flask was further stirred in an ice-water bath for 30 minutes. When the viscosity reached 1500 poise, stirring was stopped and then a polyamic acid solution was obtained.

To this polyamic acid solution, 113 g of DMF, 26 g of β-picoline, and 45 g of acetic anhydride were added. After stirring for 30 minutes, stirring was further continued below 100° C. for an hour for imidization. Then, this solution was added dropwise into methanol with vigorous stirring. The filamentous polyimide precipitated out of the methanol was pulverized by a mixer and then Soxhlet cleaning was performed with methanol. After drying at 110° C. for 2 hours, a polyimide powder was obtained.

20 g of the obtained polyimide powder, 5 g of Epikote 1032H60 (manufactured by Shell International Chemicals Corporation), and 1.5 g of 4,4'-diaminodiphenyl sulfone (curing agent) were added to be dissolved in 102 g of THF by stirring. And then a polyimide adhesive solution was obtained (solid content concentration: SC=20%).

Example 29

A polyimide adhesive solution (solid content concentration: SC=20%) was obtained in the same manner as in Example 28 except that 1,4-dioxane was used as an organic solvent instead of THF.

Example 30

A polyimide adhesive solution (solid content concentration: SC=20%) was obtained in the same manner as in Example 28 except that dioxolan was used as an organic solvent instead of THF.

Comparative Example 20

A polyimide adhesive solution (solid content concentration: SC=20%) was obtained in the same manner as in Example 28 except that dimethylformamide (DMF) was used as an organic solvent instead of THF.

Comparative Example 21

A polyimide adhesive solution (solid content concentration: SC=20%) was obtained in the same manner as in

TABLE 4

|  | Peeling strength (kgf/cm) (Before PCT treatment) | | Peeling strength (kgf/cm) (After PCT treatment) | | Peeling strength retention (%) after PCT treatment | | Solder heat resistance | Water absorption (%) |
| --- | --- | --- | --- | --- | --- | --- | --- | --- |
|  | 20° C. | 150° C. | 20° C. | 150° C. | 20° C. | 150° C. | | |
| Example 22 | 1.3 | 1.1 | 1.2 | 0.9 | 92 | 82 | ○ | 0.4 |
| Example 23 | 1.3 | 1.1 | 1.2 | 0.9 | 92 | 82 | ○ | 0.3 |
| Example 24 | 1.5 | 1.2 | 1.4 | 1.0 | 93 | 83 | ○ | 0.6 |
| Example 25 | 1.4 | 1.2 | 1.3 | 1.0 | 93 | 83 | ○ | 0.6 |
| Example 26 | 1.3 | 1.1 | 1.2 | 1.0 | 92 | 91 | ○ | 0.6 |
| Example 27 | 1.3 | 1.1 | 1.2 | 1.0 | 92 | 91 | ○ | 0.8 |
| Comparative Example 16 | 1.1 | 0.9 | 0.2 | 0.1 | 18 | 11 | X | 1.8 |
| Comparative Example 17 | 0.3 | 0.2 | 0.0 | 0.0 | 0 | 0 | ○ | 0.4 |
| Comparative Example 18 | 1.3 | 0.2 | 0.2 | 0.0 | 15 | 0 | ○ | 0.4 |
| Comparative Example 19 | 1.0 | 0.8 | 0.5 | 0.4 | 50 | 50 | ○ | 0.5 |

Example 28

In a 1000 ml glass flask, 0.112 mole of 3,3'-bis(aminophenoxyphenyl)sulfone (hereinafter referred to as BAPS-M) was added to 263 g of dimethylformamide (DMF)

Example 28 except that N-methylpyrrolildone (NMP) was used as an organic solvent instead of THF.

Comparative Example 22

A polyimide adhesive solution (solid content concentration: SC=20%) was obtained in the same manner as in Example 28 except that dimethylacetoamide (DMAc) was used as an organic solvent instead of THF.

Comparative Example 23

The preparation of a polyimide adhesive solution was tried in the same manner as in Example 28 except that methylethyl ketone (MEK) was used as an organic solvent instead of THF, but there were some insoluble portions.

Comparative Example 24

The preparation of a polyimide adhesive solution was tried in the same manner as in Example 28 except that methanol was used as an organic solvent instead of THF, but there were some insoluble portions.

Examples 30a, 30b, and 30c Comparative Examples 20a, 20b, 20c, 21a, 21b, 21c, 22a, 22b, and 22c Film-state joining components were obtained in Examples 30a, 30b and 30c, and Comparative Examples 20a, 20b, 20c, 21a, 21b, 21c, 22a, 22b, and 22c in the same manner and under the same conditions as in the above examples. Joining components in a film state which were corresponding to Comparative Examples 23, 24 and 25, wherein there were some insoluble portions, were not prepared.

Characteristic evaluation results of Examples 28 to 30 and Comparative Examples 20 to 22 are shown in Table 5.

TABLE 5

|  | THF | Dioxane | Dioxolan | THF | Dioxane | Dioxolan |
|---|---|---|---|---|---|---|
| Residual Solvent Content (%) | Example 28a 0.5 | Example 29a 3.2 | Example 30a 0.8 | Comparative Example 20a 5.1 | Comparative Example 21a 8.0 | Comparative Example 22a 6.2 |
|  | Example 28b 0.0 | Example 29b 1.3 | Example 30b 0.2 | Comparative Example 20b 2.0 | Comparative Example 21b 4.3 | Comparative Example 22b 3.5 |
|  | Example 28c 0.0 | Example 29c 0.2 | Example 30c 0.1 | Comparative Example 20c 0.9 | Comparative Example 21c 1.9 | Comparative Example 22c 1.4 |
| Peeling Strength (kgf/cm) | Example 28a 1.00 | Example 29a 0.97 | Example 30a 1.00 | Comparative Example 20a 1.00 | Comparative Example 21a 0.98 | Comparative Example 22a 1.00 |
|  | Example 28b 0.72 | Example 29b 0.66 | Example 30b 0.70 | Comparative Example 20b 0.67 | Comparative Example 21b 0.51 | Comparative Example 22b 0.53 |
|  | Example 28c 0.12 | Example 29c 0.11 | Example 30c 0.11 | Comparative Example 20c 0.13 | Comparative Example 21c 0.06 | Comparative Example 22c 0.10 |

Comparative Example 25

The preparation of a polyimide adhesive solution was tried in the same manner as in Example 28 except that ethanol was used as an organic solvent instead of THF, but there were some insoluble portions.

Example 28a, 28b, and 28c

The polyimide adhesive solution obtained in Example 28 was cast onto a polyimide film having a thickness of 25 μm (Apical 25AH, manufactured by Kaneka Corporation). After drying by heating at 100° C. for 10 minutes, a film-state joining component having a thickness of 30 μm was obtained by heating at 180° C. for 10 minutes in Example 28a, heating at 200° C. for 10 minutes in Example 28b, and heating at 220° C. for 10 minutes in Example 28c.

Examples 29a, 29b, and 29c

Film-state joining components in Examples 29a, 29b, and 29c were obtained in the same manner as in Examples 28a through 29c except that a polyimide adhesive solution obtained in Example 29 was respectively used.

Example 31

In a 500 ml glass flask, 0.1487 mole of 3,3'-bis(aminophenoxyphenyl)sulfone (hereinafter referred to as BAPS-M) was added to 280 g of dimethylformamide (DMF). And then 0.1487 mole of 2,2'-bis(4-hydroxyphenyl) propanedibenzoate 3,3',4,4'-tetracarboxylic acid dianhydride (hereinafter referred to as ESDA) was gradually added by heating at 130° C. under a nitrogen atmosphere with care to its viscosity. When the viscosity reached 1500 poise, the addition of ESDA was stopped and then a polyimide solution was obtained.

To this polyamic acid solution, 150 g of DMF, 35 g of β-picoline, and 60 g of acetic anhydride were added. After stirring for an hour, stirring was further continued in a temperature atmosphere of 100° C. for an hour for imidization. Then, this solution was added dropwise into methanol with vigorous stirring. After drying filamentous polyimide precipitated out of the methanol at 1000° C. for 30 minutes, the polyimide was pulverized by a mixer and then Soxhlet cleaning was performed with methanol. After drying at 100° C. for 2 hours, a polyimide powder was obtained. The transition temperature of the obtained polyimide was 140° C.

20 g of the obtained polyimide powder was dissolved in 83 g of DMF to obtain a varnish. The obtained varnish was cast onto a glass plate. After drying at 100° C. for 10 minutes, the varnish was peeled off from the glass plate and was set on a steel frame. A sheet having a thickness of 25 μm was obtained by further drying at 150° C. for 30 minutes. And then, Epikote 1032H60 (manufactured by Shell International Chemicals Corporation) was applied onto the surface of the obtained sheet so that the thickness may be 3 μm. After drying at 130° C. for 10 minutes, a film-state joining c met was obtained. Its water absorption was 0.6%. The obtained film-state joining component was sandwiched between a polyimide film (Apical 25AH, manufactured by Kaneka Corporation) an,d a copper foil of 25 μm thickness, and then was heated at 200° C. and pressurized at pressure 3 MPa for 20 minutes to obtain a flexible copper clad laminate. Peeling strength and solder heat resistance were measured on the obtained flexible copper clad laminate. Each measuring results are shown in Table 6.

TABLE 6

|  | Peeling strength (kgf/cm) | | Solder heat resistance | Water absorption (%) |
| --- | --- | --- | --- | --- |
|  | 20° C. | 150° C. | | |
| Example 31 | 1.0 | 0.9 | ○ | 0.6 |
| Example 32 | 1.0 | 0.8 | ○ | 0.5 |
| Example 33 | 1.0 | 0.8 | ○ | 0.5 |
| Example 34 | 1.1 | 0.7 | ○ | 0.6 |
| Comparative Example 26 | 0.1 | 0.1 | ○ | 0.6 |
| Comparative Example 27 | 0.9 | 0.2 | X | 2.0 |
| Comparative Example 28 | 1.0 | 0.9 | X | 1.8 |

Example 32

A polyimide powder was obtained in the same manner as in Example 31 except that a diamine component was 4,4'-bis (aminophenoxyphenyl) propane. The obtained polyimide had a glass transition temperature of 190° C. A film-state joining component was obtained in the same manner as in Example 31. And this material was measured for water absorption. By using this, a flexible copper clad laminate was obtained. Peeling strength and solder heat resistance were measured on the obtained flexible copper clad laminate. Each measuring results obtained are shown in Table 6.

Example 33

A polyimide powder was obtained in the same manner as in Example 31 except that a diamine component was 4,4'-[1,4-phenylenebis(1-methylethylidene). The obtained polyimide had a glass transition temperature of 210° C. A film-state joining component was obtained in the same manner as in Example 31. And this material was measured for water absorption. By using this, a flexible copper clad laminate was obtained. Peeling strength and solder heat resistance were measured on the obtained flexible copper clad laminate. Each measuring results obtained are shown in Table 6.

Example 34

A film-state joining component was obtained in the same manner as in Example 31 except that the thermosetting resin content was TETRAD-C (manufactured by Mitsubishi Gas Chemical Co., Inc.). By using this, a flexible copper clad laminate was obtained. Peeling strength and solder heat resistance were measured on the obtained flexible copper clad laminate. Each measuring results obtained are shown in Table 6.

Comparative Example 26

20 g of polyimide powder was dissolved in 83 g of DMF in the same manner as in Example 31. The obtained varnish was cast onto a glass plate. After drying at 100° C. for 10 minutes, the varnish was peeled off from the glass plate and was set on a steel frame. A sheet having a thickness of 25 μm was obtained by further drying at 150° C. for 30 minutes. The obtained sheet was sandwiched between a polyimide film (Apical 50AH, manufactured by Kaneka Corporation) and a copper foil of 25 μm thickness, and then was heated at 200° C. and pressurized at pressure 3 MHa for 20 minutes to obtain a flexible copper clad laminate.

Comparative Example 27

20 g of Pratabond M1276 (Co-polymerized nylon, manufactured by Nihon Rilsan Co., Ltd.), 30 g of Epikote 1032H60, and 3 g of diaminodiphenyl sulfone were dissolved in 83 g of DMF to obtain a varnish. The obtained varnish was cast onto a glass plate, dried at 100° C. for 10 minutes, peeled off from the glass plate and set on a steel frame. A polyimide sheet was obtained by further drying at 150° C. for 30 minutes. The sheet obtained was measured for water absorption. The obtained sheet was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Comparative Example 28

A polyimide powder was obtained in the same manner as in Example 31 except that ESDA was changed to benzophenone-tetracarboxylic acid dianhydride (BTDA). 20 g of the obtained polyimide powder was dissolved in 83 g of DMF to obtain a varnish. The obtained varnish was cast onto a glass plate, dried at 100° C. for 10 minutes, peeled off from the glass plate and set on a steel frame. A sheet having a thickness of 25 μm was obtained by further drying at 150° C. for 20 minutes. And then, Epikote 1032H60 (manufactured by Shell International Chemicals Corporation) was applied onto the surface of the obtained sheet so that the thickness after drying may be 3 μm. After drying at 130° C. for 10 minutes, a film-state joining component was obtained. The sheet obtained was measured for water absorption. The obtained sheet was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Peeling strength and solder heat resistance were measured on the obtained flexible copper clad laminate. Each measuring results obtained are shown in Table 6.

Example 35

In a 500 ml glass flask, 0.1487 mole of 3,3'-bis(aminophenoxyphenyl)sulfone (hereinafter referred to as BAPS-M) was added to 280 g of dimethylformamide (DMF). And then 0.1487 mole of 2,2'-bis (4-hydroxyphenyl) propanedibenzoate-3,3',4,4'-tetracarboxylic acid dianhydride (hereinafter referred to as ESDA) was gradually added while heating at 130° C. under a nitrogen atmosphere with care to its viscosity. When the viscosity reached 1500 poise, the addition of ESDA was stopped and then a polyimide solution was obtained.

To this polyamic acid solution, 150 g of DMF, 35 g of β-picoline, and 60 g of acetic anhydride were added. After stirring for an hour, stirring was further continued in a temperature atmosphere of 100° C. for an hour for imidization. Then, this solution was added dropwise into methanol with vigorous stirring. After drying filamentous polyimide precipitated out of the methanol at 100° C. for 30 minutes, the polyimide was pulverized by a mixer and then Soxhlet cleaning was performed with methanol. After drying at 100° C. for 2 hours, a polyimide powder was obtained. The obtained polyimide had a glass transition temperature of 140° C. The water absorption was 0.6.

20 g of the obtained polyimide powder, 5 g of Epikote 1032H60 (manufactured by Shell International Chemicals Corporation), and 3 g of 4,4'-diaminodiphenyl sulfone were dissolved in 83 g of DMF to obtain a varnish. The obtained varnish was cast onto a polyimide film having a thickness of 25 μm (Apical 25AH manufactured by Kaneka Corporation). After drying at 100° C. for 10 minutes, the varnish was further dried at 150° C. for 10 minutes to obtain a film-state joining component having a thickness of 30 μm.

The obtained film-state joining component was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate. Peeling strength and solder heat resistance were measured on the obtained flexible copper clad laminate. Each measuring results obtained are shown in Table 7.

TABLE 7

|  | Peeling strength (kgf/cm) | | Solder heat resistance | Water absorption (%) |
| --- | --- | --- | --- | --- |
|  | 20° C. | 150° C. | | |
| Example 36 | 1.0 | 0.9 | ◯ | 0.6 |
| Example 37 | 1.0 | 0.8 | ◯ | 0.5 |
| Example 38 | 1.1 | 0.9 | ◯ | 0.5 |
| Example 39 | 1.2 | 0.7 | ◯ | 0.7 |
| Comparative Example 29 | 1.0 | 0.9 | X | 1.8 |
| Comparative Example 30 | 0.2 | 0.1 | ◯ | 0.6 |
| Comparative Example 31 | 1.0 | 0.2 | X | 2.0 |

Example 36

A polyimide powder was obtained in the same manner as in Example 35 except that a diamine component was 4,4'-bis(aminophenoxyphenyl)propane. The obtained polyimide had a glass transition temperature of 190° C. Its water absorption was 0.5. A film-state joining component was obtained in the same manner as in Example 35. Further, a flexible copper clad laminate was obtained in the same manner as in Example 35. Peeling strength and solder heat resistance were measured on the obtained flexible copper clad laminate. Each measuring results obtained are shown in Table 7.

Example 37

A polyimide powder was obtained in the same manner as in Example 35 except that a diamine component was 4,4'-[1,4-phenylenebis(1-methylethylidene). The obtained polyimide had a glass transition temperature of 210° C. Its water absorption was 0.5. A film-state joining component was obtained in the same manner as in Example 35 . Further, a flexible copper clad laminate was obtained in the same manner as in Example 35. Peeling strength and solder heat resistance were measured on the obtained flexible copper clad laminate. Each measuring results obtained are shown in Table 7.

Example 38

A film-state joining component and a flexible copper clad laminate were obtained in the same manner as in Example 35 except that an adhesive was added to 20 g of polyimide powder, 5 g of glycidylamine-type epoxy resin; TETRAD-C (manufactured by Mitsubishi Gas Chemical Co., Inc.), 3 g of 4,4'-diaminophenyl sulfone to be dissolved in 83 g of DMF. Peeling strength and solder heat resistance were measured on the obtained flexible copper clad laminate. Each measuring results obtained are shown in Table 7.

Comparative Example 29

A polyimide powder was obtained ion the same manner as in Example 35 except that ESDA was changed to benzophenone-tetracarboxylic acid dianhydride. 20 g of the obtained polyimide powder, 5 g of Epikote 1032H60 (manufactured by Shell International Chemicals Corporation), and 0.5 g of 4,4'-diaminophenyl sulfone were dissolved in 83 g of DMF to obtain a varnish. The obtained varnish was cast onto a polyimide film (Apical 25AH, manufactured by Kaneka Corporation). After drying at 100° C. for 10 minutes, the varnish was further dried at 150° C. for 10 minutes to obtain a film-state joining component having a thickness of 30 μm. The obtained joining component was sandwiched between a polyimide film (Apical 50AH, manufactured by Kaneka Corporation) and a copper foil of 25 μm thickness, and then was heated at 2000° C. and pressurized at pressure 3 MPa for 20 minutes to obtain a flexible copper clad laminate.

Comparative Example 30

20 g of the polyimide powder obtained in Example 35 was dissolved in 83 g of DMF to obtain a varnish. The obtained varnish was cast onto a polyimide film (Apical 25AH, manufactured by Kaneka Corporation). After drying at 100° C. for 10 minutes, the varnish was further dried at 150° C. for 10 minutes to obtain a film-state joining component having a thickness of 30 μm. The obtained joining component was sandwiched between a polyimide film (Apical 50AH, manufactured by Kaneka Corporation) and a copper foil of 25 μm thickness. After heating at 200° C. and applying a pressure of 3 MPa for 20 minutes, a flexible copper clad laminate was obtained.

Comparative Example 31

20 g of Pratabond M1276 (Co-polymerized nylon, manufactured by Nihon Rilsan Co., Ltd.e), 5 g of Epikote 1032H60, and 3 g of 4,4'-diaminodiphenyl sulfone were dissolved in 83 g of DMF to obtain a varnish. The obtained varnish was cast onto a polyimide film (Apical 25AH, manufactured by Kaneka Corporation), dried at 100° C. for 10 minutes, further dried at 150° C. for 10 minutes. A film-state joining component having a thickness of 30 μm was obtained. The obtained joining component was sandwiched between a polyimide film (Apical 50AH, manufactured by Kaneka Corporation) and a copper foil of 25 μm thickness, and then was heated at 200° C. and pressurized at pressure 3 MPa for 20 minutes to obtain a flexible copper clad laminate.

Peeling strength and solder heat resistance were measured on the flexible copper clad laminate obtained in Comparative Examples 29 to 31. The results obtained are shown in Table 7.

Example 39

In a 500-ml glass flask, 0.1487 mole of 3,3'-bis (aminophenoxyphenyl) sulfone (hereinafter referred to as BAPS-M) was added to 280 g of dimethylformamide (IMF). And then 0.1487 mole of 2,2'-bis(4-hydroxyphenyl) propanedibenzoate-3,3',4,4'-tetracarboxylic acid dianhydride (hereinafter referred to as ESDA) was gradually added while heating at 130° C. under a nitrogen atmosphere, having paid attention to the viscosity. When the viscosity reached 1500 poise, the addition of ESDA was stopped and then a polyimide solution was obtained. The viscosity was measured by a B-type viscometer (manufactured by Tokyo Keiki Co., Ltd.).

To this polyamic acid solution, 150 g of DMF, 35 g of β-picoline, and 60 g of acetic anhydride were added. After stirring for an hour, stirring was further continued below 100° C. for an hour for imidization. Then, this solution was added dropwise into methanol with vigorous stirring. After drying filamentous polyimide precipitated out of the methanol at 100° C. for 30 minutes, the polyimide was pulverized by a mixer and then Soxhlet cleaning was performed with methanol. After drying at 100° C. for 2 hours, a polyimide powder was obtained.

20 g of the obtained polyimide powder, 5 g of Epikote 1032H60 (manufactured by Shell International Chemicals Corporation), and 3 g of 4,4'-diaminodiphenyl sulfone were dissolved in 83 g of DMF to obtain a varnish. The obtained varnish was cast onto a PET film, dried at 100° C. for 10 minutes, peeled off the PET film and set on a metal support. A film which comprises a thermoplastic polyimide and a thermosetting resin used as an adhesive layer in the present invention was obtained by drying at 150° C. for 20 minutes.

The obtained sheet was laminated on a polyimide film (Apical 50AH, manufactured by Kaneka Corporation) and a sheet of released paper in order to be laminated at the temperature of 150° C. and at the speed of 2.2 cm/min to obtain a desired adhesive laminated film for wire rod coating.

The obtained thermoplastic polyimide had a glass transition temperature of 140° C. Its water absorbtion was 0.9%. Its dielectric constant was 2.95.

As a reference to the obtained adhesive laminate film for wire rod coating and the adhesion strength of the wire rod, the released paper of this laminate film was peeled off to dispose a copper foil. After crimping at 180° C. under a pressure of 30 kg/cm$^2$ for 10 minutes, peeling strength was measured to be 1.1 kgf/cm. When a radiation resistance test was performed on the obtained adhesive laminate film for we rod coating, any changes, such as discoloration and deterioration did not occur on the film. The results obtained are shown in Table 8. The radiation resistance test was performed by 5 MGy irradiation using an electron beam of 2 MeV.

(aminophenoxyphenyl)propane. This polyamic acid was applied by flow casting onto a polyimide film (Apical (Trade mark) manufactured by Kaneka Corporation) used in Example 39. After heating at 80° C. for 25 minutes, an adhesive laminate film for wire rod coating was obtained by heating the polyamic acid at 150° C., 250° C., 270° C., and 300° C. respectively for 5 minutes to be imidized.

When the obtained film was measured for each characteristic in the same manner as in Example 39, the polyimide resin layer had a glass transition temperature of 190° C., its water absorption was 0.8%, and dielectric constant was 2.90. When peeling strength was measured in the same manner as in Example 39, its peeling strength was 1.1 kgf/cm. When a radiation resistance test was performed on the obtained adhesive laminate film for wire rod coating, any changes, such as, discoloration and deterioration did not occur on the film. The results obtained are shown in Table 8.

Example 41

A polyamic acid was obtained in the same manner as in Example 39 except that a diamine component was 4,4'-[1,4-phenylenebis(1-methylethylidene)bisaniline. This polyamic acid was applied by flow casting onto the polyimide film (Apical (Trade mark) manufactured by Kaneka Corporation) used in Example 39. After heating at 80° C. for 25 minutes, an adhesive laminate film for wire rod coating was obtained by heating the polyamic acid at 150° C., 250° C., 270° C., and 300° C. respectively for 5 minutes to be imidized.

When the obtained film was measured for each characteristic in the same manner as in Example 39, the polyimide resin layer had a glass transition temperature of 210° C., its water absorption was 0.8%, and dielectric constant was 12.88. When peeling strength was measured in the same manner as in Example 39, its peeling strength was 1.1 kgf/cm. When a radiation resistance test was performed on the obtained adhesive laminate film for wire rod coating, any changes, such as discoloration and deterioration did not occur on the film. The results obtained are shown in Table 8.

Example 42

An adhesive laminate film for wire rod coating consisting essentially of a thermoplastic polyimide and a thermosetting resin was obtained in the same manner as in Example 39 except that a thermosetting component was TETRAD-C (manufactured by Mitsubishi Gas Chemical Co., Inc.).

When the obtained film was measured for each characteristic in the same manner as in Example 39, the polyimide

TABLE 8

|  | Glass transition tempertaure (° C.) | Water absorption (%) | Dielectric constant (—) | Peeling strength (kgf/cm) | Radiation resistance test |
|---|---|---|---|---|---|
| Example 39 | 140 | 0.9 | 2.95 | 1.1 | ; |
| Example 40 | 190 | 0.8 | 2.90 | 1.1 | ; |
| Example 41 | 210 | 0.8 | 2.88 | 1.1 | ; |
| Example 42 | 140 | 0.9 | 2.96 | 1.2 | ; |
| Comparative Example 32 | None | 2.6 | 3.50 | Unattached | ; |
| Comparative Example 33 | 178 | 2.0 | 3.80 | 0.3 | Blackened |

Example 40

A polyamic acid was obtained in the same manner as in Example 39 except that a diamine component was 4,4'-bis resin layer had a glass transition temperature of 140° C., its water absorption was 0.9%, and dielectric constant was 2.96. When peeling strength was measured in the same manner as in Example 39, its peeling strength was 1.2 kgf/cm. When a radiation resistance test was performed on the obtained adhesive laminate film for wire rod coating, any changes, such as discoloration and deterioration, did not occur on the film. The results obtained are shown in Table 8.

Comparative Example 32

A polyamic acid was obtained from pimellitic acid dianhydride and ODA (oxydianiline) substantially in the same manner as in Example 39. This polyamic acid was applied by flaw casting onto the polyimide film (Apical (Trade mark) manufactured by Kaneka Corporation) used in Example 39. After heating at 80° C. for 25 minutes, an adhesive laminate film for wire rod coating was obtained by heating the polyamic acid at 150° C., 250° C., 270° C., and 300° C. respectively for 5 minutes to be imidized.

When the obtained film was measured for each characteristic in the same manner as in Example 39, the polyimide resin layer had no glass transition temperature, its water absorption was 2.6%, and dielectric constant was 3.5. It was impossible to measure peeling strength of the obtained adhesive laminate film for wire rod coating under the conditions of temperature at 180° C. under a pressure of 30 kg/cm$^2$ for 10 minutes due to being incapable to be bonded. When a radiation resistance test was performed on the obtained adhesive laminate film for wire rod coating, any changes, such as discoloration and deterioration, did not occur on the film. The results obtained are shown in Table 8.

Comparative Example 33

An adhesive laminate film for wire rod coating was obtained in the same manner as in Example 40 except that an adhesive which comprised Epikote 828 (Trade mark: manufactured by Shell International Chemicals Corporation) was used instead of a polyimide film having thermoplastic properties (adhesion).

When the obtained film was measured for respective characteristics in the same manner as in Example 39, the adhesive layer had a glass transition temperature of 178° C., its water absorption was 2.0%, and dielectric constant was 3.8. The peeling strength of the obtained adhesive laminate film for wire rod coating was 0.3 kg/cm. As a result of a radiation resistance test, the film was blackened. The results obtained are shown in Table 8.

Industrial Applicability

The present invention can provide a polyimide resin of novel configuration having excellent adhesion and low water absorption, as well as excellent heat resistance, mechanical strength, and electrical characteristics which are found in polyimide.

In addition, the present invention can provide a resin composition which is capable of being used as an adhesive at relatively low temperatures, for example, 250° C. Unlike conventional heat-resisting adhesives, the resin composition of the present invention is not necessary to be used at high temperatures, but it has excellent adhesive strength on a polyimide film, which retains excellent adhesive strength up to high temperatures. Tie resin composition can achieve a low water absorption as low as 1.5% or lower. Since its peeling strength retention is high after a PCT treatment due to control of the residual volatile component of 3 wt % or lower, it has solder heat resistance free from swelling and the like when it is dip-soldered. Further, the polyimide resin composition is capable of controlling immersion of a solvent and maintaining high retention of peeling strength after the PCT treatment which is a reliability test of materials for electronic devices because an amino-terminated polyimide oligomer used as a polyimide resin has multiple cross-liking points with epoxy resin to be close packed structure.

Moreover, the present invention can provide an adhesive solution which is capable of removing its solvent by drying at relatively low temperatures, using the polyimide resin of the present invention and a specific solvent, which lead to powerful adhesive strength on a laminated layer to be formed later.

As described above, the polyimide resin, resin composition, and adhesive solution have an advantage of having great technical value as materials for electronic devices required for high reliability and heat resistance.

The adhesive laminate film for wire rod coating according to the present invention is constructed by a polyimide having excellent heat resistance, radiation resistance, electrical characteristics, chemical resistance, and low temperature characteristics, and an adhesive layer which comprises a thermoplastic resin having a glass transition temperature of 100 to 250° C., water absorption of 1.5% or lower, dielectric constant of 3.2 or lower, and a thermosetting resin having exhibiting excellent adhesion at low temperatures. The adhesive laminate film for wire rod coating has, therefore, excellent characteristics comprehensively, such as superior workability, flexibility, and adhesion at low temperatures, few deterioration caused by water adsorption, few dielectric loss at the time of passage of electric current and superior radiation resistance when coating the film on a wire rod. The adhesive laminate film is particularly suitable for coating on a superconductive wire rod, and the like, so that the film is most suitable for a use for a superconductive magnet for accelerator. Specifically, when the adhesive laminate film for wire rod coating according to the present invention is coated on a wire rod, the film can be bonded to the wire rod by heating within the scope of temperatures at which little deterioration in characteristics of the wire rod, so that the coating of the film is possible without any loss of characteristics of the wire rod coated with the film, for example, superconductivity characteristics when the wire rod is a superconductive wire rod.

There have thus been shown and described a novel polyimide resin, a resin composition, an adhesive solution, a film-state joining component, an adhesive laminate film and a production method therefor which fulfill all the objects and advantages sought therefor. Many changes, modifications, variations and other uses and applications of the subject invention will, however, become apparent to those killed in the art after considering this specification and the accompanying drawings which disclose the preferred embodiments thereof. All such changes, modifications, variations and other uses and applications which do not depart from the spirit and scope of the invention, which is to be limited only by the claims which follow.

What is claimed is:

1. A resin composition comprising a polyimide resin obtained by reacting tetracarboxylic acid dianhydride containing ester acid dianhydride represented by the general formula (1):

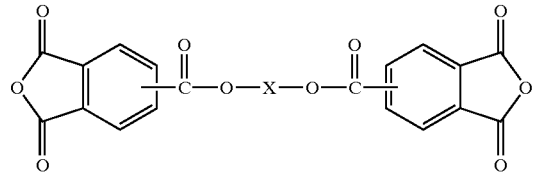

(1)

wherein X represents —(CH$_2$)$_k$—, or is a divalent group comprising an aromatic ring; and k is an integer from 1 to 10; with diamine containing an aromatic diamine represented by the general formula (2):

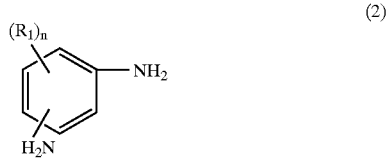

(2)

wherein R$_1$ represents alkyl, fluoro-alkyl, and alkoxyl groups or a halogen group; and n is an integer from 0 to 4, R$_1$ whose number is n is the same or different, and/or an aromatic diamine represented by the general formula (3):

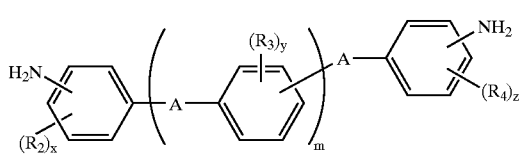

(3)

wherein A is at least one selected from the groups consisting of a single bond, —O—, —(CH$_2$)n—, —CO—, —C(=O)O—, —NHCO—, —C(CH$_3$)$_2$—, —C(CF$_3$)$_2$—, —S—, or —SO$_2$—, R$_2$, R$_3$, and R$_4$ represent independently alkyl, fluoro-alkyl, and alkoxyl groups or a halogen group, and are the same or different groups; x, y, z, m, and n are each an integer from 0 to 4; and A whose number is (m+1) is respectively the same or different; and a thermosetting resin.

2. A resin composition comprising a polyimide resin obtained by reacting tetracarboxylic acid dianhydride containing ester acid dianhydride represented by the general formula (1):

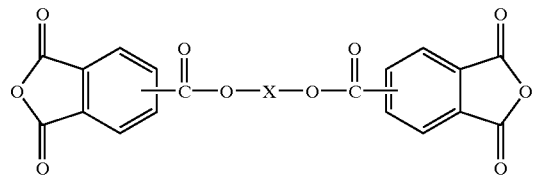

(1)

wherein X represents —(CH$_2$)$_k$— or is a divalent group comprising an aromatic ring; and k is an integer from 1 to 10; with aromatic diamine represented by the general formula (4):

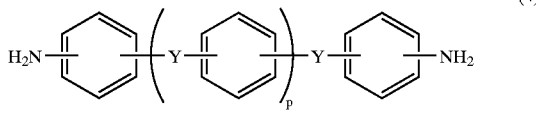

(4)

wherein Y is at least one selected from the groups consisting of a single bond, —CO—, —SO$_2$—, —O—, —S—, —C(CH$_2$)$_q$—, —NHCO—, —C(CH$_3$)$_2$—, —C(CF$_3$)$_2$—, or —C(=O)O—; p and q are each an integer from 1 to 5; and a thermosetting resin.

3. A polyimide resin obtained by reacting tetracarboxylic acid dianhydride containing ester-acid dianhydride represented by the general formula (1):

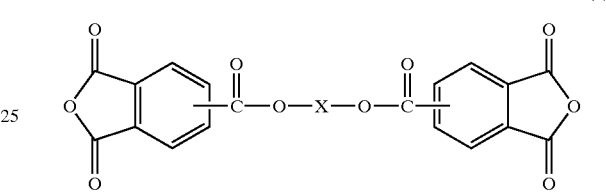

(1)

wherein X represents —(CH$_2$)$_k$— or is a divalent group comprising an aromatic ring; and k is an integer from 1 to 10; with aromatic diamine represented by the general formula (4):

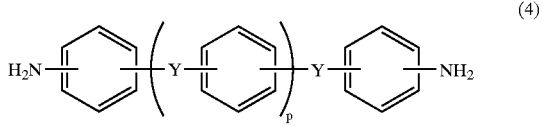

(4)

wherein Y is at least one selected from the groups consisting of a single bond, —CO—, —SO$_2$—, —O—, —S—, —(CH$_2$)$_q$—, —NHCO—, —C(CH$_3$)$_2$—, —C(CF$_3$)$_2$—, or —C(=O)O—; p and q are each an integer from 1 to 5, and siloxane diamine represented by the general formula (5):

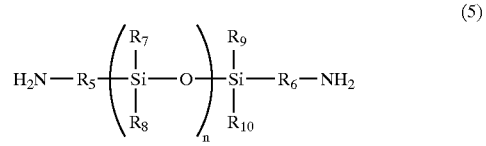

(5)

wherein R$_5$ and R$_6$ are each a divalent aliphatic group whose carbon number is from 1 to 4 or a divalent aromatic group; R$_7$, R$_8$, R$_9$, and R$_{10}$ are each a monovalent aliphatic group whose carbon number is from 1 to 4 or a monovalent aromatic group; and n is an integer from 1 to 10.

4. The resin composition according to claim 2, wherein said diamine represented by the general formula (4) is aromatic diamine represented by the general formula (6):

(6)

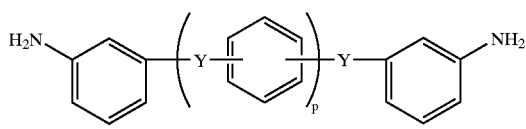

wherein Y is at least one group selected from the groups consisting of a single bond -, —CO—, —SO$_2$—, —O—, —S—, —(CH$_2$)$_q$—, —NHCO—, —C(CH$_3$)$_2$—, —C(CF$_3$)$_2$—, or —C(=O)O—; p and q are each an integer from 1 to 5.

5. The polyimide resin according to claim 3, further comprising siloxane diamine in an amount of 1 to 30 mole % based on the total amount of diamine.

6. A resin composition comprising a polyimide resin obtained by reacting tetracarboxylic acid dianhydride containing 2,2-(4-hydroxyphenyl) propanedibenzoate-3,3',4,4'-tetracarboxylic acid dianhydride represented by the general formula (7),

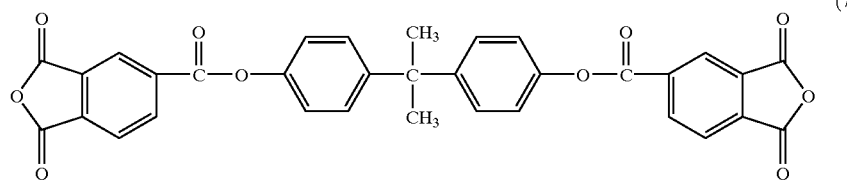

aromatic diamine represented by the formula (2),

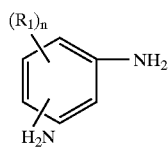

wherein R$_1$ represents alkyl, fluoro-alkyl, and alkoxyl groups or a halogen group; n is an integer from 0 to 4; and R$_1$ whose number is n is the same or different: and/or diamine containing aromatic diamine represented by the general formula (3):

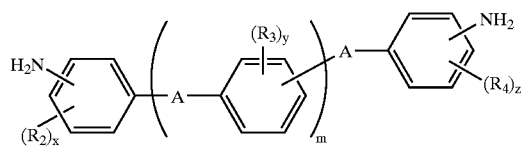

wherein A is at least one selected from the groups consisting of a single bond, —O—, —(CH$_2$)$_n$—, —CO—, —C(=O)O—, —NHCO—, —C(CH$_3$)$_2$—, —C(CF$_3$)$_2$—, —S—, or —SO$_2$—, R$_2$, R$_3$, and R$_4$ represent independently alkyl, fluoro-alkyl, and alkoxyl groups or a halogen group, and are the same or different groups; X, y, z, m, and n are each an integer from 0 to 4; and A whose number is (m+1) is respectively the same or different; and a thermosetting resin.

7. A resin composition comprising a polyimide resin obtained by reacting tetracarboxylic acid dianhydride containing ester-acid dianhydride represented by the general formula (1):

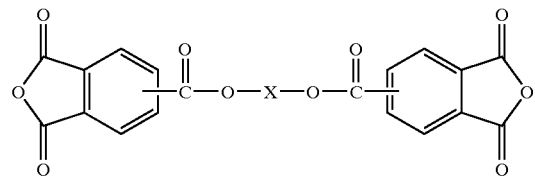

wherein X represents —(CH$_2$)$_k$— or is a divalent group comprising an aromatic ring; and k is an integer from 1 to 10; with aromatic diamine represented by the general formula (4):

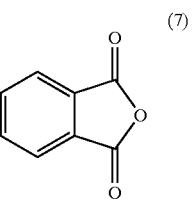

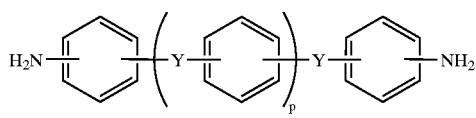

wherein Y is at least one selected from the groups consisting of a single bond, —CO—, —SO$_2$—, —O—, —S—, —(CH$_2$)$_q$—, —NHCO—, —C(CH$_3$)$_2$—, —C(CF$_3$)$_2$, or —C(=O)O—; p and q are each an integer from 1 to 5, and siloxane diamine represented by the general formula (5):

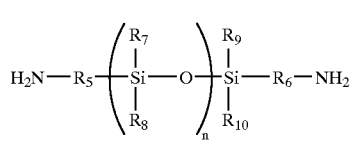

wherein R$_5$ and R$_6$ are each a divalent aliphatic group whose carbon number is from 1 to 4 or a divalent aromatic group; R$_7$, R$_8$, R$_9$, and R$_{10}$ are each a monovalent aliphatic group whose carbon number is from 1 to 4 or a monovalent aromatic group; and n is an integer from 1 to 10; and a thermosetting resin.

8. The resin composition according to any one of claims 1, 2, 6, or 7, wherein the polyimide resin has a glass transition temperature from 100° C. to 250° C. and water absorption of 1.5% or lower.

9. The resin composition according to claim 8, wherein the polyimide resin lies a glass transition temperature from 100° C. to 250° C., water absorption of 1.5% or lower, and dielectric constant of 3.2 or lower.

10. A polyimide adhesive solution in which said polyimide resin reacting tetracarboxylic acid dianhydride containing 50 mole % or more of an ester acid dianhydride represented by the general formula (1):

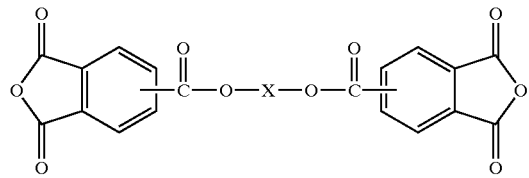

(1)

wherein X represents —(CH$_2$)$_k$—, or is a divalent group comprising an aromatic ring; and k is an integer from 1 to 10; with diamine containing an aromatic diamine represented by the general formula (2):

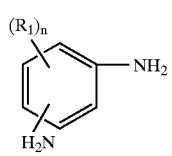

(2)

wherein R$_1$ represents alkyl, fluoro-alkyl, and alkoxyl groups or a halogen group; and n is an integer from 0 to 4, R$_1$ whose number is n is the same or different, and/or an aromatic diamine represented by the general formula (3) or (4):

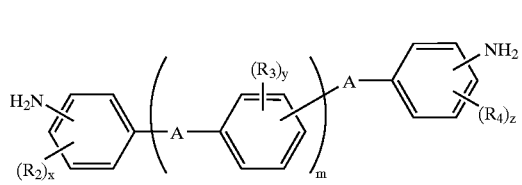

(3)

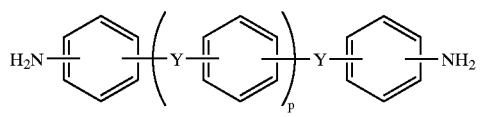

(4)

wherein A is at least one selected from the groups consisting of a single bond, —O—, —(CH$_2$)$_n$—, —CO—, —C(=O)O—, —NHCO—, —C(CH$_3$)$_2$—, —C(CF$_3$)$_2$—, —S—, or —SO$_2$—, R$_2$, R$_3$, and R$_4$ represent independently alkyl, fluoro-alkyl, and alkoxyl groups or a halogen group, and are the same or different groups; x, y, z, m, and n are each an integer from 0 to 4; and A whose number is (m+1) is respectively the same or different, Y is at least one selected from the groups consisting of a single bond, —CO—, —SO$_2$—, —O—, —S—, —(CH$_2$)$_q$—, —NHCO—, —C(CH$_3$)$_2$—, —C(CF$_3$)$_2$—, or —C(=O)O—; p and q are each an integer from 1 to 5, and siloxane diamine represented by the general formula (5):

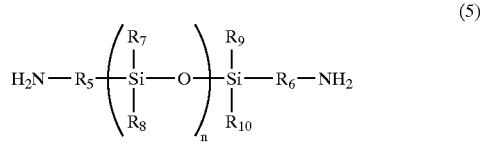

(5)

wherein R$_5$ and R$_6$ are each a divalent aliphatic group whose carbon number is from 1 to 4 or a divalent aromatic group; R$_7$, R$_8$, R$_9$, and R$_{10}$ are each a monovalent aliphatic group whose carbon number is from 1 to 4 or a monovalent aromatic group; and n is an integer from 1 to 10; epoxy resin, and a curing agent are dissolved in an organic solvent.

11. A film-like joining component formed by laminating a thermosetting resin onto one side of both sides of a base film comprising a thermoplastic polyimide resin selected from the group consisting of;

a polyimide resin obtained by reacting tetracarboxylic acid dianhydride containing ester acid dianhydride represented by the general formula (1):

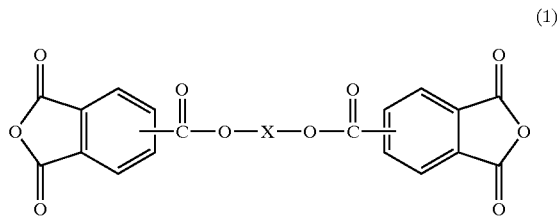

(1)

wherein X represents —(CH$_2$)$_k$—, or is a divalent group comprising an aromatic ring; and k is an integer from 1 to 10; with diamine containing an, aromatic diamine represented by the general formula (2):

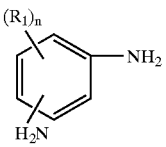

(2)

wherein R$_1$ represents alkyl, fluoro-alkyl, and alkoxyl groups or a halogen group; and n is an integer from 0 to 4, R$_1$ whose number is n is the same or different, and/or an aromatic diamine represented by the general formula (3):

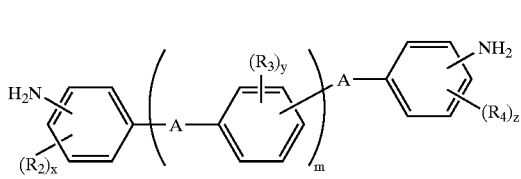

(3)

wherein A is at least one selected from the groups consisting of a single bond, —O—, —(CH$_2$)$_n$—, —CO—, —C(=O)O—, —NHCO—, —C(CH$_3$)$_2$—, —C(CF$_3$)$_2$—, —S—, or —SO$_2$—, R$_2$, R$_3$, and R$_4$ represent independently alkyl, fluoro-alkyl, and alkoxyl groups or a halogen group, and are the same or different groups; x, y, z, m, and n are: each an integer from 0 to 4; and A whose number is (m+1) is respectively the same or different;

a polyimide resin obtained by reacting tetracarboxylic acid dianhydride containing ester acid dianhydride represented by the general formula (1):

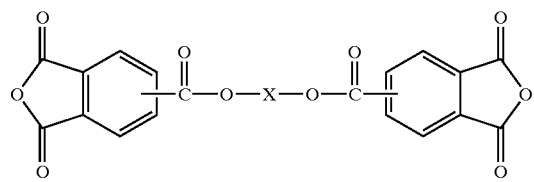
(1)

wherein X represents —(CH$_2$)$_k$— or is a divalent group comprising an aromatic ring; and k is n integer from 1 to 10; with aromatic diamine represented by the general formula (4):

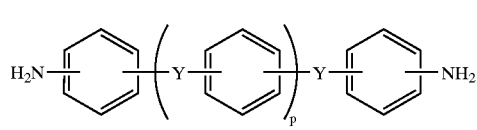
(4)

wherein Y is at least one selected from the groups consisting of a single bond, —CO—, —SO$_2$—, —O—, —S—, —(CH$_2$)$_q$—, —NHCO—, —C(CH$_3$)$_2$—, —C(CF$_3$)$_2$—, or —C(=O)O—; p and q are each an integer from 1 to 5;

a polyimide resin obtained by reacting tetracarboxylic acid dianhydride containing ester-acid dianhydride represented by the general formula (1):

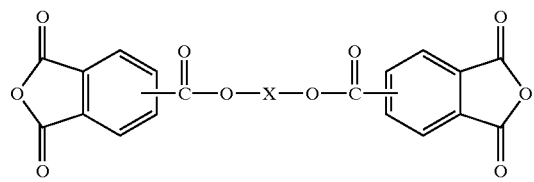
(1)

wherein X represents —(CH$_2$)$_k$— or is a divalent group comprising an aromatic ring; and k is an integer from 1 to 10; with aromatic diamine represented by the general formula (4):

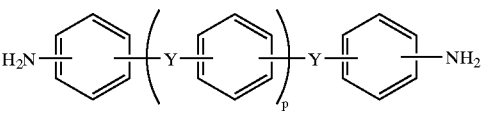
(4)

wherein Y is at least one selected from the groups consisting of a single bond, —CO—, —SO$_2$—, —O—, —S—, —(CH$_2$)$_q$—, —NHCO—, —C(CH$_3$)$_2$—, —C(CF$_3$)$_2$—, or —C(=O)O—; p and q are each an integer from 1 to 5, and siloxane diamine represented by the general formula (5):

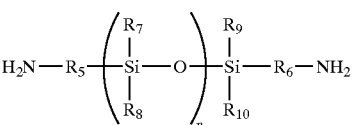
(5)

wherein R$_5$ and R$_6$ are each a divalent aliphatic group whose carbon number is from 1 to 4 or a divalent aromatic group; R$_7$, R$_8$, R$_9$, and R$_{10}$ are each a monovalent aliphatic group whose carbon number is from 1 to 4 or a monovalent aromatic group; and n is an integer from 1 to 10;

a polyimide resin obtained by reacting tetracarboxylic acid dianhydride containing 2,2-(4-hydroxyphenyl) propanedibenzoate-3,3',4,4'-tetracarboxylic acid dianhydride represented by the general formula (7),

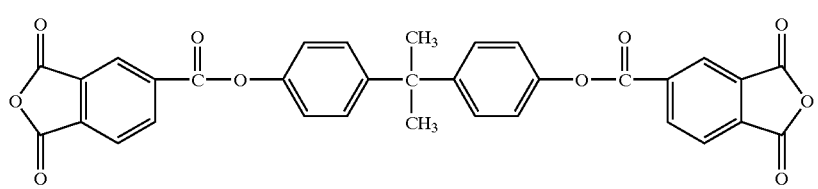
(7)

with aromatic diamine represented by the formula (2),

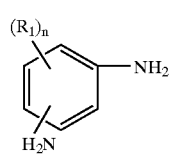
(2)

wherein R$_1$ represents alkyl, fluoro-alkyl, and alkoxyl groups or a halogen group; n is an integer from 0 to 4; and R$_1$ whose number is n is the same or different; and/or diamine containing aromatic diamine represented by the general formula (3):

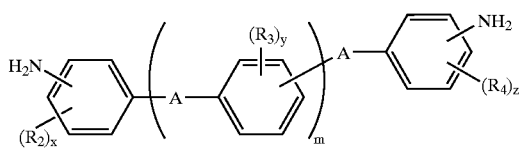

wherein A is at least one selected from the groups consisting of a single bond, —O—, —(CH$_2$)$_n$—, —CO—, —C(=O)O—, —NHCO—, —C(CH$_3$)$_2$—, —C(CF$_3$)$_2$—, —S—, or —SO$_2$—, R$_2$, R$_3$, and R$_4$ represent independently alkyl, fluoro-alkyl, and alkoxyl groups or a halogen group, and are the same or different groups; X, y, z, m, and n are each an integer from 0 to 4; and A whose number is (m+1) is respectively the same or different; and a polyimide resin obtained by reacting tetracarboxylic acid dianhydride which is adjusted to have a residual impurities content of 1 wt % or lower and contains 2,2-(4-hydroxyphenyl) propanedibenzoate-3,3'4,4'-tetracarboxylic acid dianhydride represented by the general formula (7),

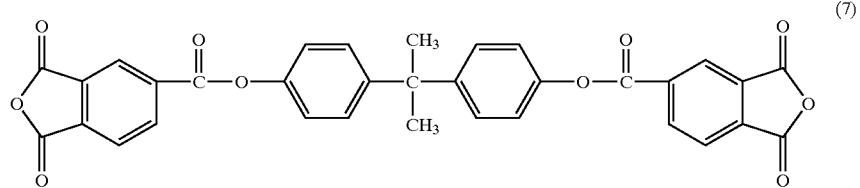

with aromatic diamine represented by the general formula (2),

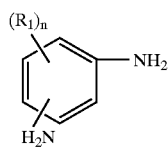

wherein R$_1$ represents alkyl, fluoro-alkyl, and alkoxyl groups or a halogen groups; n is an integer from 0 to 4, and R$_1$ whose number is n is the same or different; and/or diamine containing aromatic diamine represented by the general formula (3),

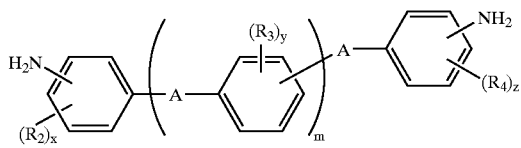

wherein A is at least one selected from the groups consisting of a single bond, —O—, —(CH$_2$)$_n$—, —CO—, —C(=O)O—, —NHCO—, —C(CH$_3$)$_2$—, —C(CF$_3$)$_2$—, —S— or —SO$_2$—, R$_2$, R$_3$, and R$_4$ represent independently alkyl, fluoro-alkyl, and alkoxyl groups or a halogen group; and are the same or different groups; X, y, z, m, and n are each an integer from 0 to 4; and A whose number is (m+1) is respectively the same or different.

12. The resin composition according to any one of claims 1, 2, 6, or 7, wherein said thermosetting resin is an epoxy resin.

13. The resin composition according to claim 12, wherein said thermosetting resin includes two epoxy groups or more.

14. The resin composition according to claim 12, wherein said epoxy resin has an epoxy equivalent of 250 or less.

15. The resin composition according to any one of claims 1, 2, 6, or 7, having water absorption after curing of 1.5% or lower.

16. The resin composition according to claim 12, comprising said polyimide resin and said epoxy resin, wherein the resin composition has a residual volatile component after curing of 3 wt % or lower.

17. The resin composition according to claim 16, wherein components of said residual volatile component are at least one kind of solvent having a low boiling point which dissolves said polyimide resin and said epoxy resin.

18. The resin composition according to claim 12, wherein said polyimide resin is amine-terminated polyimide oligomer.

19. The resin composition according to claim 18, wherein said polyimide oligomer has a number-average molecular weight of 2,000 to 50,000.

20. The polyimide adhesive solution according to claim 10, wherein said organic solvent contains a cyclic ether solvent of 30 wt % or higher.

21. A film-like joining component according to claim 11, wherein said thermosetting resin has a film thickness after dried of 0.5 to 5 μm.

22. A film-like joining component obtained by laminating the resin composition according to claim 12 on one side or both sides of a polyimide base film.

23. A film-like joining component obtained by depositing a film-like resin composition layer on a polyimide base film, wherein said film-like resin composition is obtained by dissolving the resin composition according to claim 12 in an organic solvent, applying by flow or casting onto a support, and peeling off a coating film of the resin composition from the support.

24. A film-like joining component having a film-like resin composition layer, wherein said film-like resin is obtained by dissolving the resin composition according to claim 12 in an organic solvent, applying by flow or casting onto at least one side of a polyimide base film, and drying.

25. A film-like joining component obtained by applying the polyimide adhesive solution according to claim 10 by flow or casting onto a support and peeling off an adhesive coating film from the support.

26. A film-like joining component having a polyimide adhesive layer on its surface, wherein said polyimide adhesive layer, is obtained by applying the polyimide adhesive solution according to claim 10 by flow or casting onto at least one side of a polyimide base film, and drying.

27. An adhesive laminate film for wire rod coating using the film-like joining component according to claim 22.

* * * * *

UNITED STATES PATENT AND TRADEMARK OFFICE
CERTIFICATE OF CORRECTION

PATENT NO.   : 6,693,162 B2
DATED        : February 17, 2004
INVENTOR(S)  : Hiroyuki Tsuji et al.

It is certified that error appears in the above-identified patent and that said Letters Patent is hereby corrected as shown below:

Column 58,
Line 36, immediately after "containing an" delete "," (comma); and
Line 66, immediately after "and n are" delete ":" (semicolon).

Signed and Sealed this

Eighth Day of February, 2005

JON W. DUDAS
*Director of the United States Patent and Trademark Office*